(12) United States Patent
Lim et al.

(10) Patent No.: US 11,741,740 B2
(45) Date of Patent: Aug. 29, 2023

(54) FINGERPRINT SENSOR, METHOD OF FABRICATING THE SAME, AND DISPLAY DEVICE INCLUDING THE SAME

(71) Applicant: SAMSUNG DISPLAY CO., LTD., Yongin-si (KR)

(72) Inventors: Jae Ik Lim, Hwaseong-si (KR); Ji Hye Kim, Asan-si (KR); Byung Han Yoo, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/235,359

(22) Filed: Apr. 20, 2021

(65) Prior Publication Data

US 2021/0357613 A1 Nov. 18, 2021

(30) Foreign Application Priority Data

May 18, 2020 (KR) .................... 10-2020-0058812

(51) Int. Cl.
*G06V 40/13* (2022.01)
*H10K 59/40* (2023.01)
*H10K 71/00* (2023.01)

(52) U.S. Cl.
CPC ......... *G06V 40/1318* (2022.01); *H10K 59/40* (2023.02); *H10K 71/00* (2023.02)

(58) Field of Classification Search
CPC ...... G06V 40/1318; G06F 3/042–0428; H01L 27/3227; H01L 27/323; H01L 27/3234
See application file for complete search history.

(56) References Cited

U.S. PATENT DOCUMENTS

| 2017/0017824 A1 | 1/2017 | Smith et al. |
| 2019/0197290 A1* | 6/2019 | Chen .................. G06V 40/1359 |
| 2019/0391701 A1* | 12/2019 | Liao ..................... G06V 40/1318 |
| 2020/0327296 A1* | 10/2020 | Wu .................... H01L 27/14623 |
| 2022/0058365 A1* | 2/2022 | Tomioka ............ G06V 40/1318 |

FOREIGN PATENT DOCUMENTS

KR 10-2020-0010834 1/2020

* cited by examiner

*Primary Examiner* — Roberto W Flores
(74) *Attorney, Agent, or Firm* — F. Chau & Associates, LLC

(57) ABSTRACT

A fingerprint sensor includes a light sensing layer having a light sensing element in which a sensing current flows in response to incident light and a light guide layer disposed on the light sensing layer. The light guide layer includes first light-transmitting films spaced apart from one another, a light-blocking film disposed between the first light-transmitting films, and a second light-transmitting film disposed between each of the first light-transmitting films and the light-blocking film.

26 Claims, 24 Drawing Sheets

FINGERPRINT SENSOR, METHOD OF FABRICATING THE SAME, AND DISPLAY DEVICE INCLUDING THE SAME

CROSS-REFERENCE TO RELATED APPLICATION

This application claims priority under 35 U.S.C. § 119 to Korean Patent Application No. 10-2020-0058812, filed on May 18, 2020, the disclosure of which is incorporated by reference herein in its entirety.

TECHNICAL FIELD

The present disclosure relates to a fingerprint sensor and, more specifically, to a fingerprint sensor, a method of fabricating a fingerprint sensor, and a display device including a fingerprint sensor.

DISCUSSION OF THE RELATED ART

Display devices are employed in a variety of electronic devices such as smart phones, tablet computers, laptop/notebook computers, monitors, and a televisions. Portable electronic devices such as smartphones, tablet computers, and laptop/notebook computers represent a large and growing segment of electronic devices. Due in part to their small size and personal availability, portable electronic devices are often used to stores private information such as contact numbers, records of calls, messages, pictures, memos, user's web surfing information, location information, and financial information. Therefore, in order to protect private information stored in portable electronic devices, fingerprint authentication has been used to verify a fingerprint, which is an example of a user's biometric information. Fingerprint authentication may be performed using a fingerprint sensor that scans the user's fingerprint. The fingerprint sensor may be implemented by using an optical scanner, an ultrasonic scanner, or a capacitive scanner. An optical fingerprint sensor may include a collimator having an optical sensing unit for sensing light, an opening providing light to the optical sensing unit, and a light-blocking unit for blocking light. Fingerprint sensors have been integrated into display devices such as those used in smartphones so as to provide an integrated solution for display and fingerprint authentication.

Fingerprint sensors may be disposed in the bezel area or the non-display area of a display device. However, when this is done, the size of the non-display area of the display device might be larger than is desired. Therefore, fingerprint sensors have recently been disposed in the display area of display devices. In such a case, the fingerprint sensor is disposed under the display panel, and because of the structure of the display area that may block light, only a small amount of light may be incident on the light sensing part of the fingerprint sensor. It may be contemplated to reduce the area of the light-blocking part of the collimator in order to increase the amount of light incident on the light sensing part of the fingerprint sensor. In such case, however, noise light incident on the light sensing part may increase. As a result, the accuracy of fingerprint recognition may be lowered.

SUMMARY

A fingerprint sensor includes a light sensing layer having a light sensing element in which a sensing current flows according to incident light and a light guide layer disposed on the light sensing layer. The light guide layer includes first light-transmitting films spaced apart from one another, a light-blocking film disposed between the first light-transmitting films, and a second light-transmitting film disposed between each of the first light-transmitting films and the light-blocking film.

A display device includes a display panel for displaying images and a fingerprint sensor disposed on a surface of the display panel and sensing light having passed through the display panel. The fingerprint sensor includes a light sensing layer having a light sensing element in which a sensing current flows according to incident light and a light guide layer disposed on the light sensing layer. The light guide layer includes first light-transmitting films spaced apart from one another, a light-blocking film disposed between the first light-transmitting films, and a second light-transmitting film disposed between each of the first light-transmitting films and the light-blocking film.

A method of fabricating a fingerprint sensor includes forming a light sensing layer having a light sensing element in which a sensing current flows according to incident light, forming an organic material on the light sensing layer to form a light-transmitting layer, forming mask patterns on the light-transmitting layer, etching the light-transmitting layer according to the mask patterns to form first light-transmitting films, removing the mask patterns, forming an inorganic material on the first light-transmitting films to form a second light-transmitting film, and forming an organic material on the second light-transmitting film to form a light-blocking film.

A display device includes a display panel including a display area and a non-display area at least partially surrounding the display area. The display area includes a plurality of pixels configured to display an image and a fingerprint sensor disposed within the display area of the display panel. The fingerprint sensor includes a light sensing element and a light guide layer disposed on the light sensing element. The light guide layer includes a plurality of first light-transmitting films, a light-blocking film disposed between neighboring light-transmitting films of the plurality of first light-transmitting films, and a second light-transmitting film disposed between each of the plurality of first light-transmitting films and the light-blocking film.

BRIEF DESCRIPTION OF THE DRAWINGS

The above and other features of the present inventive concept will become more apparent by describing in detail exemplary embodiments thereof with reference to the accompanying drawings, in which.

DETAILED DESCRIPTION OF THE EMBODIMENTS

Figure 1:
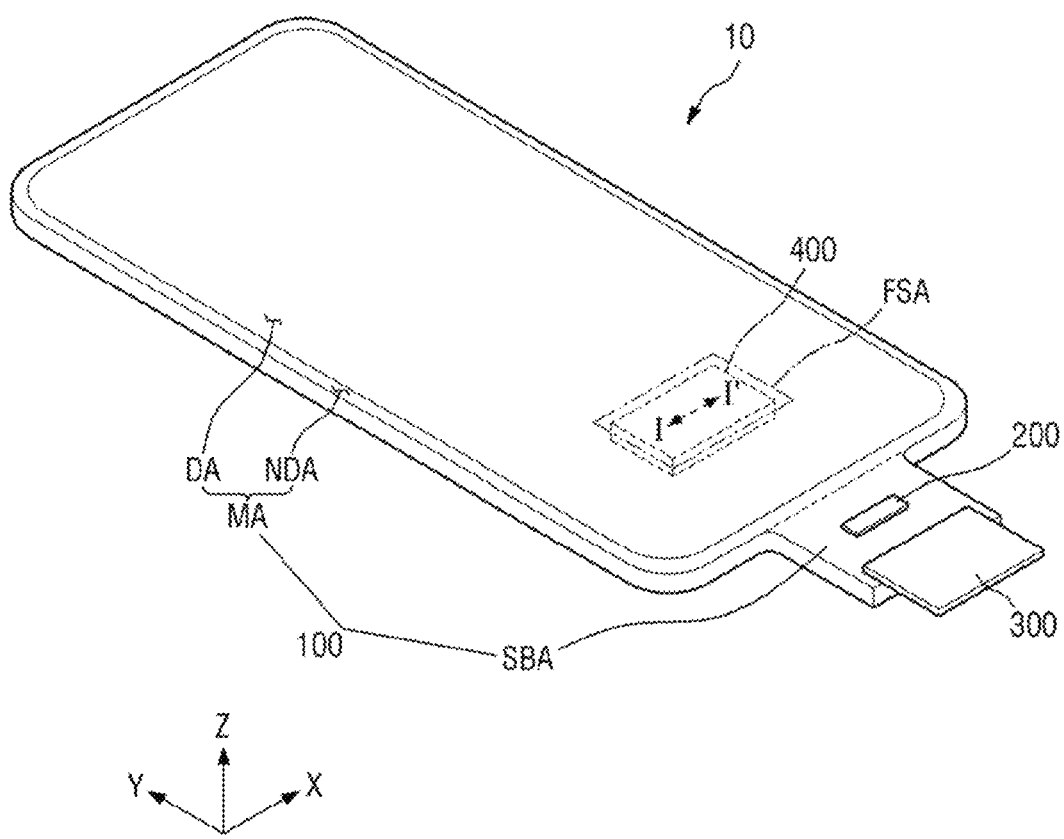
FIG. 1 is a perspective view illustrating a display device according to an exemplary embodiment of the present disclosure.

Exemplary embodiments of the present inventive concept will be described more fully hereinafter with reference to the accompanying drawings. Like reference numerals may refer to like elements throughout the specification and the accompanying drawings.

It will be understood that when a component, such as a film, a region, a layer, or an element, is referred to as being "on", "connected to", "coupled to", or "adjacent to" another component, it can be directly on, connected, coupled, or adjacent to the other component, or intervening components may be present. It will also be understood that when a component is referred to as being "between" two components, it can be the only component between the two components, or one or more intervening components may also be present. It will also be understood that when a component is referred to as "covering" another component, it can be the only component covering the other component, or one or more intervening components may also be covering the other component. Other words use to describe the relationship between elements may be interpreted in a like fashion.

It will be further understood that descriptions of features or aspects within each exemplary embodiment are available for other similar features or aspects in other exemplary embodiments, unless the context clearly indicates otherwise. Thus, it is contemplated that all features and structures described herein may be mixed and matched in any desirable manner.

As used herein, the singular forms "a", "an" and "the" are intended to include the plural forms as well, unless the context clearly indicates otherwise.

Spatially relative terms, such as "below", "lower", "above", "upper", etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" other elements or features would then be oriented "above" the other elements or features. Thus, the exemplary term "below" can encompass both an orientation of above and below.

According to an exemplary embodiment of the present invention, a fingerprint sensor may include a light sensing layer and a light guide layer disposed thereon. The light sensing layer may include a light sensing element, such as a sensor that generates a sensing current in response to and/or in proportion to incident light. The light guide layer may include light-transmitting films and a light-blocking film disposed between neighboring light-transmitting films. The light guide layer may further include an additional light-transmitting film between the first light-transmitting films and the light-blocking film.

FIG. 1 is a perspective view illustrating a display device according to an exemplary embodiment of the present disclosure.

Referring to FIG. 1, a display device 10 is configured for displaying moving images and/or still images. The display device 10 may be used as the display screen of portable electronic devices such as a mobile phone, a smart phone, a tablet computer, a smart watch, a watch phone, a mobile communications terminal, an electronic notebook, an electronic book (e-book), a portable multimedia player (PMP), a navigation device, and/or a ultra mobile PC (UMPC), as well as the display screen of various products such as a television, a laptop/notebook computer, a monitor, an electronic billboard, and/or an Internet of Things device.

The display device 10 may be a light-emitting display device such as an organic light-emitting diode (OLED) display device using organic light-emitting diodes, a quantum-dot light-emitting display device including a quantum-dot light-emitting layer, an inorganic light-emitting display device including an inorganic semiconductor, and a micro light-emitting display device using micro light-emitting diodes (LED). In the following description, an organic light-emitting diode display device is described as an example of the display device 10. It is, however, to be understood that the present disclosure is not necessarily limited thereto and that any form of display device, including one of the aforementioned types of display devices, may be used in any of the examples discussed herein.

The display device 10 includes a display panel 100, a display driving circuit 200, a circuit board 300, and a fingerprint sensor 400.

The display panel 100 may be formed in a rectangular plane having shorter sides extending in a first direction (x-axis direction) and longer sides extending in a second direction (y-axis direction) intersecting the first direction (x-axis direction). Each of the corners where the short side in the first direction (x-axis direction) meets the longer side in the second direction (y-axis direction) may be rounded with a predetermined curvature (so as to create a display panel 100 having a rounded-rectangle shape) or may be a right angle (so as to create a display panel 100 having a rectangular shape). The shape of the display panel 100, when viewed from the top, is not necessarily limited to a quadrangular shape, but may be formed in a different polygonal shape, a circular shape, an elliptical shape, or any other arbitrary shape. The display panel 100 may be formed flat, but is not necessarily limited thereto. For example, the display panel 100 may be formed at left and right ends, and may include a curved portion having a constant curvature or a varying curvature. In addition, the display panel 100 may be flexible so that it can be curved, bent, folded, or rolled without cracking or otherwise breaking.

The display panel 100 may include the main area MA and the subsidiary area SBA.

The main area MA may include a display area DA where images are displayed, and a non-display area NDA at least partially surrounding the display area DA. The display area DA may include a plurality of pixels for displaying images. There might be no pixels disposed within the non-display area NDA. The non-display area NDA may be defined as the area from the outer side of the display area DA to the edge of the display panel 100.

The display area DA may include a fingerprint sensing area FSA. The fingerprint sensing area FSA refers to an area where the fingerprint sensor 400 is disposed. The fingerprint sensing area FSA may be, but is not necessarily limited to, a part of the display area DA as shown in FIG. 1. In this case, fingerprints can only be sensed within this one particular section of the display area DA. Alternatively, the fingerprint sensing area FSA may be formed throughout the entire display area DA and may be substantially identical to the display area DA. In this case, fingerprints may be sensed anywhere within the display area DA.

The subsidiary area SBA may protrude from one side of the main area MA in the second direction (y-axis direction). The length of the subsidiary area SBA in the first direction (x-axis direction) may be smaller than the length of the main area MA in the first direction (x-axis direction). The length of the subsidiary area SBA in the second direction (y-axis direction) may be smaller than the length of the main area MA in the second direction (y-axis direction). It is, however, to be understood that the present disclosure is not necessarily limited thereto.

Although the subsidiary area SBA is unfolded in the example shown in FIG. 1, the subsidiary area SBA may be bent and may be bent behind the main area MA so as to be disposed on the lower surface of the main area MA. When the subsidiary area SBA is bent, it may overlap the main area MA in the thickness direction (z-axis direction) of the display panel 100. The display driving circuit 200 may be disposed in the subsidiary area SBA.

The display driving circuit 200 may generate signals and voltages for driving the display panel 100. The display driving circuit 200 may be implemented as an integrated circuit (IC) and may be attached to the display panel 100 by a chip on glass (COG) technique, a chip on plastic (COP) technique, or an ultrasonic bonding. It is, however, to be understood that the present disclosure is not necessarily limited thereto. For example, the display driving circuit 200 may be attached on the circuit board 300 by the chip-on-film (COF) technique.

The circuit board 300 may be attached to an end of the subsidiary area SBA of the display panel 100 using an anisotropic conductive film. Accordingly, the circuit board 300 may be electrically connected to the display panel 100 and the display driving circuit 200. The display panel 100 and the display driving circuit 200 may receive digital video data, timing signals, and driving voltages through the circuit board 300. The circuit board 300 may be a flexible printed circuit board, a printed circuit board, or a flexible film such as a chip on film.

The fingerprint sensor 400 may be disposed on the lower surface of the display panel 100. The fingerprint sensor 400 may be attached on the lower surface of the display panel 100 using a transparent adhesive member. For example, the transparent adhesive member may be a transparent adhesive film such as an optically clear adhesive (OCA) film or a transparent adhesive resin such as an optically clear resin (OCR).

Figure 2:
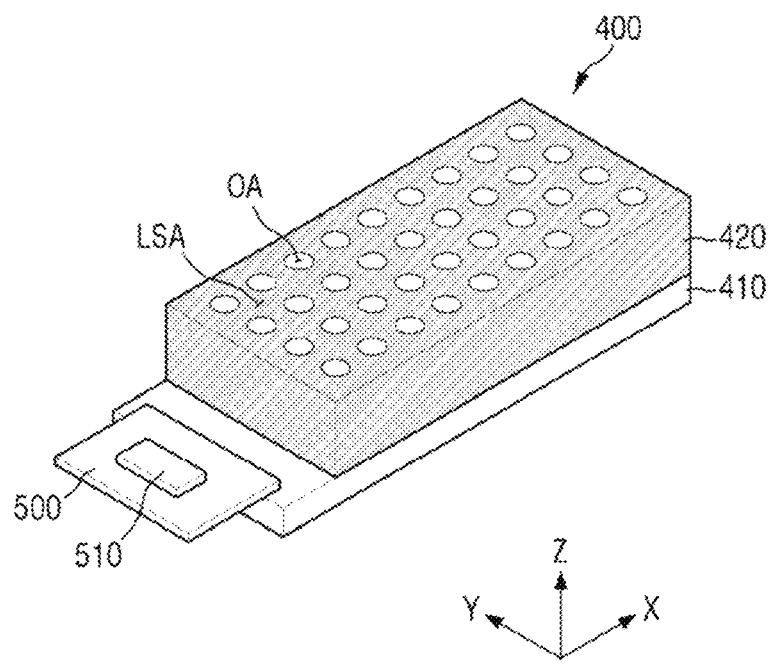
FIG. 2 is a perspective view illustrating the fingerprint sensor of FIG. 1.

FIG. 2 is a perspective view illustrating the fingerprint sensor of FIG. 1.

Referring to FIG. 2, the fingerprint sensor 400 may include a fingerprint sensing layer 410 (which may be a light sensing layer) and a light guide layer 420.

The fingerprint sensing layer 410 may include sensor pixels arranged in the first direction (x-axis direction) and the second direction (y-axis direction). Each of the sensor pixels may include a light sensing element through which a sensing current flows according to incident light, at least one transistor connected to the light sensing element, and at least one capacitor connected to the light sensing element or the transistor. The light sensing element may be a photo-diode or a photo-transistor.

The light guide layer 420 is disposed on the fingerprint sensing layer 410. The light guide layer 420 includes a plurality of openings OA arranged in the first direction (x-axis direction) and the second direction (y-axis direction) and a light-blocking area LSA disposed between the openings OA. Each of the openings OA may be a region that transmits light, while the light-blocking area LSA may be a region that blocks light. Each of the openings OA may have a circular shape when viewed from the top as shown in FIG. 2. It is, however, to be understood that the present disclosure is not necessarily limited thereto. Each of the openings OA may have an oval or polygonal shape when viewed from the top.

A fingerprint circuit board 500 may be disposed on a portion of the fingerprint sensing layer 410 that is not covered by the light guide layer 420. The fingerprint circuit board 500 may be attached to a portion of the upper surface of the fingerprint sensing layer 410 that is not covered by the light guide layer 420 using an anisotropic conductive film. Accordingly, the fingerprint circuit board 500 may be electrically connected to sensor pixels of the fingerprint sensing layer 410. Therefore, each of the sensor pixels of the fingerprint sensing layer 410 may output a sensing voltage according to the sensing current of the light sensing element through the fingerprint circuit board 500. A fingerprint driver circuit 510 electrically connected to the fingerprint circuit board 500 may recognize a fingerprint pattern of a finger based on sensing voltages of sensor pixels.

The fingerprint driver circuit 510 may be disposed, but is not necessarily limited to being disposed, on the fingerprint circuit board 500 as shown in FIG. 2. The fingerprint driver circuit 510 may be disposed on a separate circuit board that is electrically connected to the fingerprint circuit board 500. The fingerprint circuit board 500 may be a flexible printed circuit board, a printed circuit board, or a flexible film such as a chip-on film.

Figure 3:
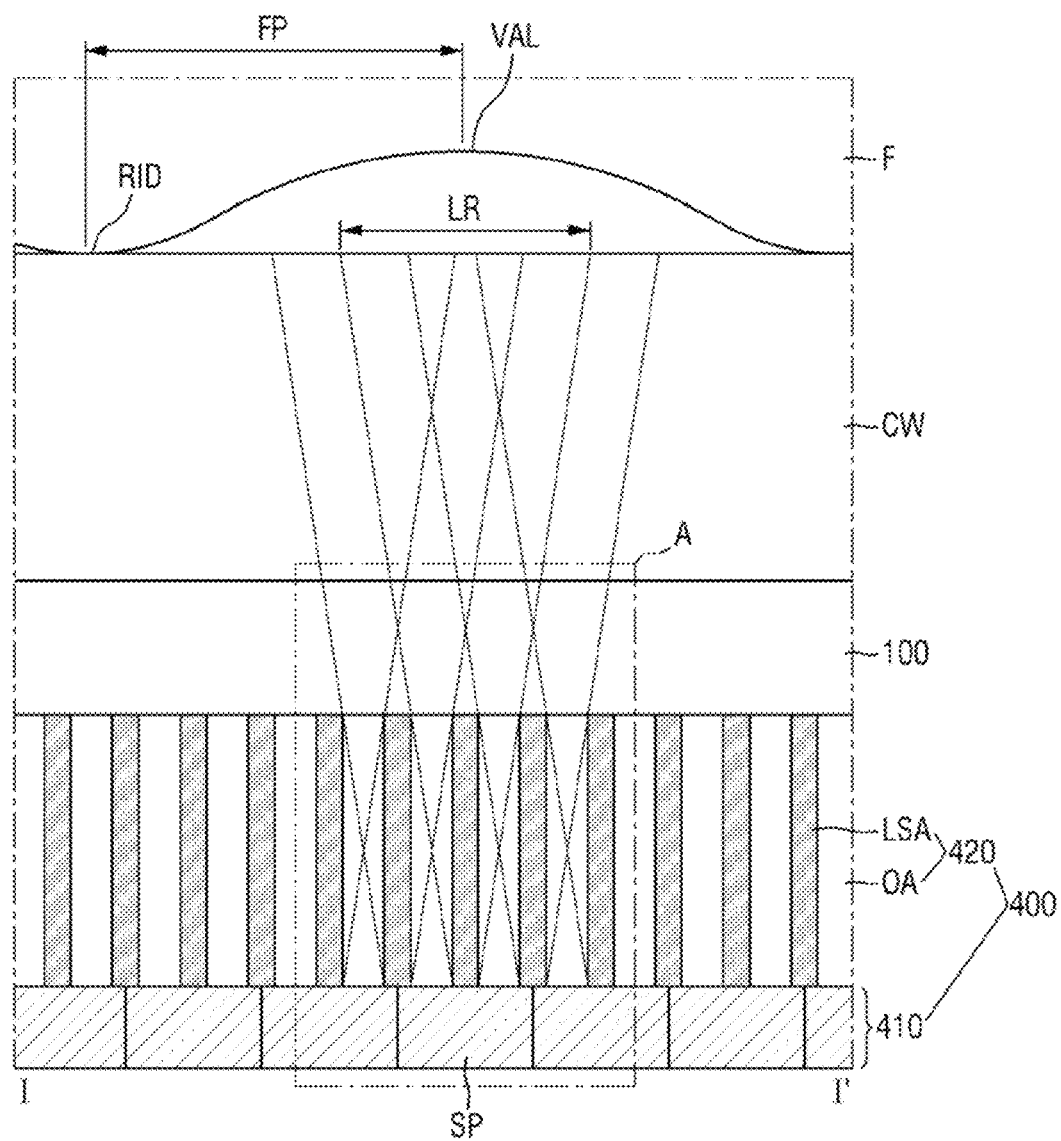
FIG. 3 is a cross-sectional view illustrating an example of the display panel and the fingerprint sensor taken along line I-I' of FIG. 1.

FIG. 3 is a cross-sectional view illustrating an example of the display panel and the fingerprint sensor taken along line I-I' of FIG. 1. FIG. 3 shows an example where a user has touched on the display device 10 with her/his finger F for fingerprint recognition.

Referring to FIG. 3, the display device further includes a cover window CW disposed on the upper surface of the display panel 100. The cover window CW may be disposed on the display panel 100 so that it covers the upper surface of the display panel 100. The cover window CW can protect the upper surface of the display panel 100. The cover window CW may be attached to the upper surface of the display panel 100 using a transparent adhesive member.

The cover window CW may be made of a transparent material such as glass and/or plastic. For example, when the cover window CW is glass, it may be ultra thin glass (UTG)

having a thickness of 0.1 mm or less. When the cover window CW is made of plastic, it may include a transparent polyimide film.

The fingerprint sensor 400 may be disposed on the lower surface of the display panel 100. The fingerprint sensor 400 may be attached on the lower surface of the display panel 100 using a transparent adhesive member.

The fingerprint sensor 400 may include the fingerprint sensing layer 410 including sensor pixels SP, and the light guide layer 420 including the openings OA and the light-blocking area LSA disposed between the openings OA. The sensor pixels SP may overlap the openings OA of the light guide layer 420 in the third direction (z-axis direction), respectively.

Each of the openings OA of the light guide layer 420 may be a passage through which light reflected off the ridges RID and valleys VAL of the fingerprint of a finger F is incident. For example, when a user's finger F is brought into contact with the cover window CW, the light output from the display panel 100 may be reflected off the ridges and valleys of the fingerprint of the finger F. The light reflected off the finger F can be incident on the sensor pixels SP of the fingerprint sensing layer 410 through the display panel 100 and the openings OA of the light guide layer 420.

The range of light LR incident on the sensor pixels SP through the openings OA of the light guide layer 420 may be shorter than the distance FP between the ridge RID and the valley VAL of the fingerprint of the finger F. The distance FP between the ridge RID and the valley VAL of the finger F may be approximately 500 μm. Accordingly, the sensing current flowing through the light sensing element of each of the sensor pixels SP may be different depending on whether the light is reflected from the ridges or valleys of the fingerprint of the finger F. Therefore, the sensing voltages output from the sensor pixels SP may be different depending on whether the light is reflected from the ridges or valleys of the fingerprint of the finger F. In this manner, the fingerprint driver circuit 510 can recognize a fingerprint pattern of the finger F according to the sensing voltages of the sensor pixels SP.

Figure 4:
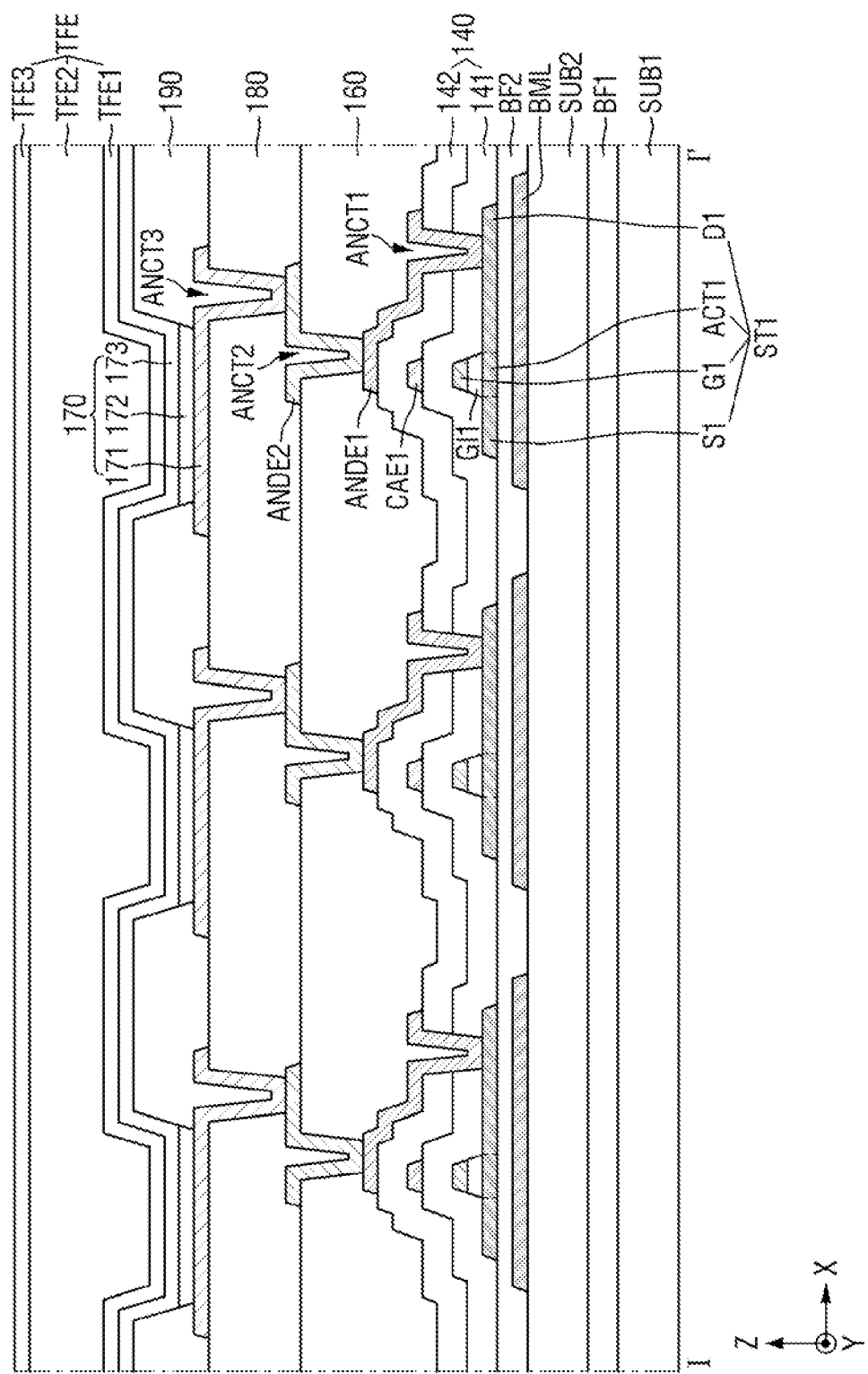
FIG. 4 is an enlarged, cross-sectional view illustrating an example of the display panel of area A of FIG. 3.

FIG. 4 is an enlarged, cross-sectional view illustrating an example of the display panel of area A of FIG. 3.

Referring to FIG. 4, the display panel may include display pixels displaying images. Each of the display pixels may include a first thin-film transistor ST1 and a light-emitting element 170.

A first buffer film BF1 may be disposed on a first substrate SUB1. A second substrate SUB2 may be disposed on the first buffer film BF1. A second buffer film BF2 may be disposed on the second substrate SUB2.

Each of the first substrate SUB1 and the second substrate SUB2 may be made of an insulating material such as a polymer resin. For example, the first substrate SUB1 and the second substrate SUB2 may include polyimide. Each of the first substrate SUB1 and the second substrate SUB2 may be a flexible substrate that can be bent, folded, rolled, and so on without cracking or otherwise breaking.

Each of the first buffer layer BF1 and the second buffer layer BF2 is a layer for protecting the thin-film transistors of a thin-film transistor layer and an emissive layer 172 of an emission material layer from moisture permeating through the first substrate SUB1 and the second substrate SUB2, which are vulnerable to moisture permeation. Each of the first buffer layer BF1 and the second buffer layer BF2 may be made up of multiple inorganic layers alternately stacked on one another. For example, each of the first and second buffer layers BF1 and BF2 may be made up of multiple layers in which one or more inorganic layers of a silicon nitride layer, a silicon oxynitride layer, a silicon oxide layer, a titanium oxide layer and an aluminum oxide layer are alternately stacked on one another.

A light-blocking film BML may be disposed on the second substrate SUB2. The light blocking layer BML may overlap a first active layer ACT1 of the first thin-film transistor ST1 in the third direction (z-axis direction) in order to prevent leakage current when the light is incident on the first active layer ACT1 of the first thin-film transistor ST1. The light-blocking film BML may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof. The light blocking layer BML may be omitted.

The first active layer ACT1 of the first thin-film transistor ST1 may be disposed on the second buffer layer BF2. The first active layer ACT1 of the first thin-film transistor ST1 includes polycrystalline silicon, monocrystalline silicon, low-temperature polycrystalline silicon, amorphous silicon, or oxide semiconductor. Since the first active layer ACT1 of the first thin-film transistor ST1 is not covered by the first gate insulating layer GI1 but is exposed is doped with impurities or ions, it can have a desired conductivity. Therefore, a first source electrode S1 and a first drain electrode D1 of the first active layer ACT1 of the first thin-film transistor ST1 may be formed.

The first gate insulating layer GI1 may be disposed on the first active layer ACT1 of the first thin-film transistor ST1. Although the first gate insulating layer GI1 is disposed between the first gate electrode G1 and the first active layer ACT1 of the first thin-film transistor ST1 in the example shown in FIG. 4, the present disclosure is not necessarily limited thereto. The first gate insulating layer GI1 may be disposed between the first interlayer dielectric layer 141 and the first active layer ACT1 and between the first interlayer dielectric layer 141 and the second buffer layer BF2 as well. The first gate insulating layer GI1 may be formed of an inorganic layer, for example, a silicon nitride layer, a silicon oxynitride layer, a silicon oxide layer, a titanium oxide layer, or an aluminum oxide layer.

The first gate electrode G1 of the first thin-film transistor ST1 may be disposed on the first gate insulating layer GI1. The first gate electrode G1 of the first thin-film transistor ST1 may overlap the first active layer ACT1 in the third direction (z-axis direction). The first gate electrode G1 of the first thin-film transistor ST1 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

The first interlayer dielectric layer 141 may be disposed on the first gate electrode G1 of the first thin-film transistor ST). The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

A first capacitor electrode CAE1 may be disposed on the first interlayer dielectric layer 141. The first capacitor electrode CAE1 may overlap the first gate electrode G1 of the first thin-film transistor ST1 in the third direction (z-axis direction). Since the first interlayer dielectric layer 141 has a predetermined dielectric constant, a capacitor can be formed by the first capacitor electrode CAE, the first gate electrode G1, and the first interlayer dielectric layer 141 disposed between them. The first capacitor electrode CAE1 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

A second interlayer dielectric layer 142 may be disposed over the first capacitor electrode CAE1. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include a number of inorganic layers.

A first anode connection electrode ANDE1 may be disposed on the second interlayer dielectric layer 142. The first anode connection electrode ANDE1 may be connected to a first drain electrode D1 of the first thin-film transistor ST1 through a first anode contact hole ANCT1 that penetrates the first interlayer dielectric layer 141 and the second interlayer dielectric layer 142 to expose the first drain electrode D1 of the first thin-film transistor ST1. The first anode connection electrode ANDE1 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

Together the first interlayer dielectric layer 141 and the second interlayer dielectric layer 142 may form an interlayer dielectric 140.

A first organic layer 160 may be disposed on the first anode connection electrode ANDE1 for planarization. The first organic layer 160 may be formed as an organic layer such as an acryl resin, an epoxy resin, a phenolic resin, a polyamide resin and a polyimide resin.

A second anode connection electrode ANDE2 may be disposed on the first organic layer 160. The second anode connection electrode ANDE2 may be connected to the first anode connection electrode ANDE1 through a second anode contact hole ANCT2 that penetrates through the first organic layer 160 to expose the first anode connection electrode ANDE1. The second anode connection electrode ANDE2 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

The second organic layer 180 may be disposed on the second anode connection electrode ANDE2. The second organic layer 180 may be formed as an organic layer such as an acryl resin, an epoxy resin, a phenolic resin, a polyamide resin and a polyimide resin.

In FIG. 4, the first thin-film transistor ST1 is implemented as a top-gate transistor in which the first gate electrode G1 is located above the first active layer ACT1. It is, however, to be understood that the present disclosure is not necessarily limited thereto. The first thin-film transistor ST1 may be implemented as a bottom-gate transistor in which the first gate electrode G1 is located below the first active layer ACT1, or as a double-gate transistor in which the first gate electrodes G1 are disposed above and below the first active layer ACT1.

Light-emitting elements 170 and a bank 190 may be disposed on the second organic layer 180. Each of the light-emitting elements 170 may include a first light-emitting electrode 171, an emissive layer 172, and a second light-emitting electrode 173.

The first light-emitting electrode 171 may be formed on the second organic layer 180. The first light-emitting electrode 171 may be connected to the second anode connection electrode ANDE2 through a third anode contact hole ANCT3 that penetrates through the second organic layer 180 to expose the second anode connection electrode ANDE2.

In the top-emission organic light-emitting diode that light exits from the emissive layer 172 toward the second light-emitting electrode 173, the first light-emitting electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy is an alloy of silver (Ag), palladium (Pd) and/or copper (Cu).

The bank 190 may partition the first light-emitting electrode 171 on the second organic layer 180 to serve to define an emission area EA. The bank 190 may be formed to cover the edge of the first light-emitting electrode 171. The bank 190 may be formed of an organic layer such as an acryl resin, an epoxy resin, a phenolic resin, a polyamide resin and a polyimide resin.

In the emission area EA, the first light-emitting electrode 171, the emissive layer 172 and the second light-emitting electrode 173 are stacked on one another sequentially, so that holes from the first light-emitting electrode 171 and electrons from the second light-emitting electrode 173 are combined with each other in the emissive layer 172 to emit light.

The emissive layer 172 is formed on the first light-emitting electrode 171 and the bank 190. The emissive layer 172 may include an organic material and emit light of a certain color. For example, the emissive layer 172 may include a hole transporting layer, an organic material layer, and an electron transporting layer.

The second light-emitting electrode 173 is formed on the emissive layer 172. The second light-emitting electrode 173 may be formed to cover the emissive layer 172. The second light-emitting electrode 173 may be a common layer formed across all of the emission areas EA. A capping layer may be formed on the second light-emitting electrode 173.

In the top-emission structure, the second light-emitting electrode 173 may be formed of a transparent conductive oxide (TCO) such as indium tin oxide (ITO) and indium zinc oxide (IZO) that can transmit light, or a semi-transmissive conductive material such as magnesium (Mg), silver (Ag) and an alloy of magnesium (Mg) and silver (Ag). When the second light-emitting electrode 173 is formed of a semi-transmissive conductive material, the light extraction efficiency can be increased by using microcavities.

An encapsulation layer TFE may be disposed on the second light-emitting electrode 173. The encapsulation layer TFE includes at least one inorganic layer to prevent permeation of oxygen or moisture into the light-emitting element layer. In addition, the encapsulation layer TFE includes at least one organic layer to protect the light-emitting element layer from foreign substances such as dust. For example, the encapsulation layer TFE includes a first inorganic layer TFE, an organic layer TFE2, and a second inorganic layer TFE3.

The first inorganic layer TFE1 may be disposed on the second light-emitting electrode 173, the organic layer TFE2 may be disposed on the first inorganic layer TFE1, and the second inorganic layer TFE3 may be disposed on the organic layer TFE2. The first inorganic layer TFE1 and the second inorganic layer TFE3 may be made up of multiple layers in which one or more inorganic layers of a silicon nitride layer, a silicon oxynitride layer, a silicon oxide layer, a titanium oxide layer and an aluminum oxide layer are alternately stacked on one another. The organic layer TFE2 may be a monomer.

Figure 5:
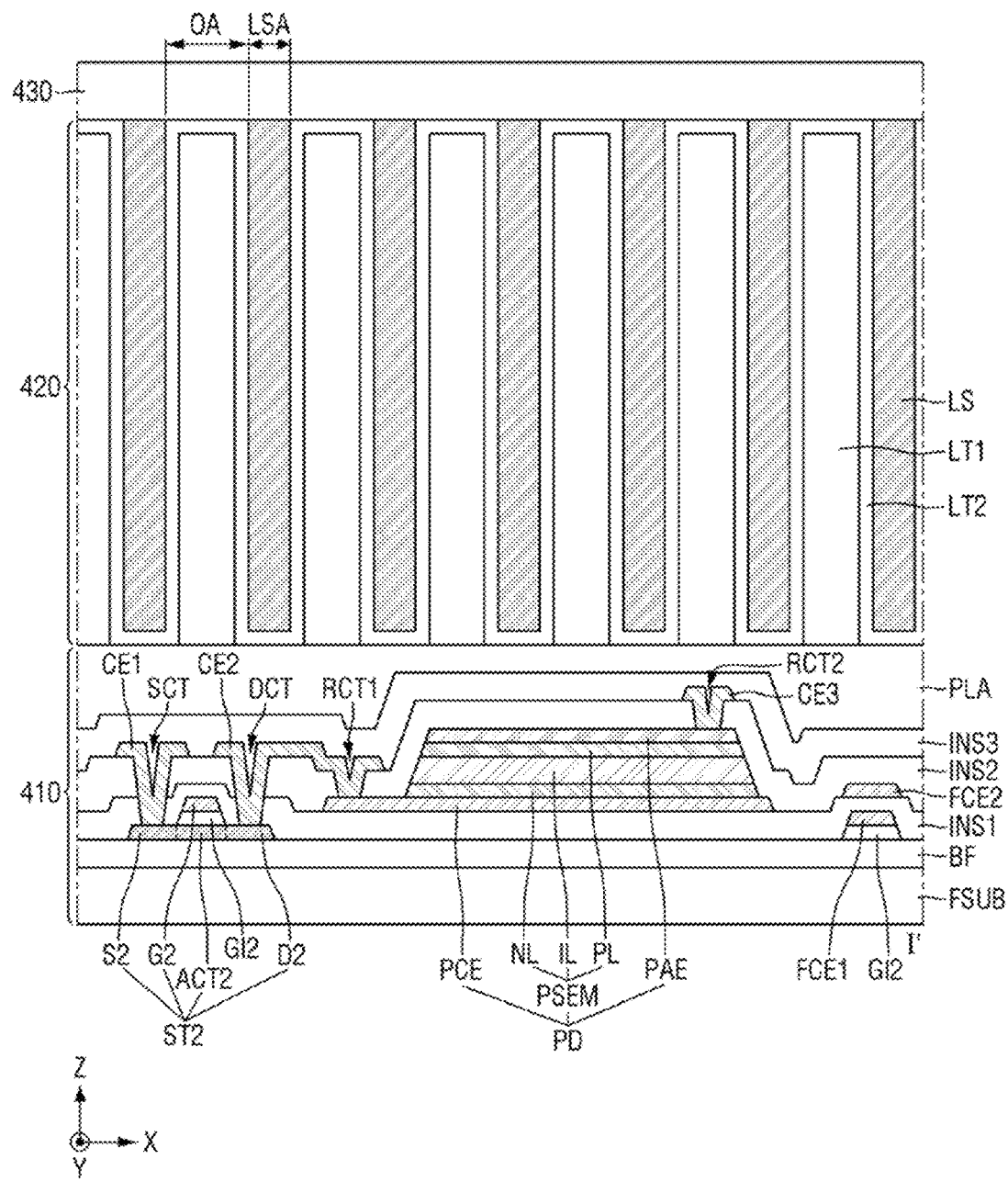
FIG. 5 is an enlarged, cross-sectional view illustrating an example of the fingerprint sensor of area A of FIG. 3.

FIG. 5 is an enlarged, cross-sectional view illustrating an example of the fingerprint sensor of area A of FIG. 3.

Referring to FIG. 5, a fingerprint sensor 400 may include a fingerprint sensing layer 410 and a light guide layer 420 disposed on the fingerprint sensing layer 410.

The fingerprint sensing layer 410 may include sensor pixels SP sensing light. Each of the sensor pixels SP may include a second thin-film transistor ST2 and a light sensing element PD.

A buffer layer BF may be disposed on a fingerprint sensor substrate FSUB. The fingerprint sensor substrate FSUB may be made of an insulating material such as a polymer resin. For example, the fingerprint sensor substrate FSUB may include polyimide. Each fingerprint sensor substrate FSUB may be a flexible substrate that can be bent, folded, or rolled without cracking or otherwise breaking.

The buffer layer BF is configured for protecting the thin-film transistor and the light sensing element PD of the fingerprint sensing layer 410 from moisture permeating through the fingerprint sensor substrate FSUB, which is vulnerable to moisture permeation. The buffer layer BF may be formed of a plurality of inorganic layers stacked on one another alternately. For example, the buffer layer BF may be made up of multiple layers in which one or more inorganic layers of a silicon nitride layer, a silicon oxynitride layer, a silicon oxide layer, a titanium oxide layer and an aluminum oxide layer are alternately stacked on one another.

A second active layer ACT2 of the second thin-film transistor ST2 may be disposed on the buffer layer BF. The second active layer ACT2 of the second thin-film transistor ST2 includes polycrystalline silicon, monocrystalline silicon, low-temperature polycrystalline silicon, amorphous silicon, or oxide semiconductor. Since the second active layer ACT2 of the second thin-film transistor ST2 is not covered by the second gate insulating layer GI2 but is exposed is doped with impurities or ions, it can have a desired conductivity. Therefore, the second source electrode S2 and the second drain electrode D2 of the second active layer ACT2 of the second thin-film transistor ST2 may be formed.

The second gate insulating layer GI2 may be disposed on the second active layer ACT2 of the second thin-film transistor ST2. Although the second gate insulating layer GI2 is disposed between the second gate electrode G2 and the second active layer ACT2 of the second thin-film transistor ST2 and between a first fingerprint capacitor electrode FCE1 and the buffer layer BF in the example shown in FIG. 5, the present disclosure is not necessarily limited thereto. The second gate insulating layer GI2 may be disposed between the first insulating layer INS1 and the second active layer ACT2 and between the first insulating layer INS1 and the buffer layer BF. The second gate insulating layer GI2 may be formed of an inorganic layer, for example, a silicon nitride layer, a silicon oxynitride layer, a silicon oxide layer, a titanium oxide layer, or an aluminum oxide layer.

The second gate electrode G2 and the first fingerprint capacitor electrode FCE1 of the second thin-film transistor ST2 may be disposed on the second gate insulating layer GI2. The second gate electrode G2 of the second thin-film transistor ST2 may overlap the second active layer ACT2 in the third direction (z-axis direction). The second gate electrode G2 of the second thin-film transistor ST2 and the first fingerprint capacitor electrode FCE1 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

The first insulating layer INS1 may be disposed on the second gate electrode G2 of the second thin-film transistor ST2 and the first fingerprint capacitor electrode FCE1. The first insulating layer INS1 may be formed of an inorganic layer, for example, a silicon nitride layer, a silicon oxynitride layer, a silicon oxide layer, a titanium oxide layer, or an aluminum oxide layer. The first insulating layer INS1 may include a number of inorganic layers.

The light sensing element PD and the second fingerprint capacitor electrode FCE2 may be disposed on the first insulating layer INS1. The second fingerprint capacitor electrode PCE2 may overlap the first fingerprint capacitor electrode PCE1 in the third direction (z-axis direction). Since the first insulating layer INS1 has a predetermined dielectric constant, a capacitor may be formed by the first fingerprint capacitor electrode FCE1, the second fingerprint capacitor electrode PCE2, and the first insulating layer INS1 disposed therebetween.

The light sensing element PD may be implemented as, but is not necessarily limited to, a photo-diode as shown in FIG. 5. The light sensing element PD may alternatively be implemented as a photo-transistor. The light sensing element PD may include a first sensing electrode PCE, a sensing semiconductor layer PSEM, and a second sensing electrode PAE. The first sensing electrode PCE may be a cathode electrode, and the second sensing electrode PAE may be an anode electrode.

The first sensing electrode PCE may be disposed on the first insulating layer INS1. The first sensing electrode PCE may be made of the same material as the second fingerprint capacitor electrode PCE2. The first sensing electrode PCE and the second fingerprint capacitor electrode PCE2 may be made up of a single layer of molybdenum (Mo), titanium (Ti), copper (Cu) and/or aluminum (Al), or may be made up of a stack structure of aluminum and titanium (Ti/Al/Ti), a stack structure of aluminum and ITO (ITO/Al/ITO), an APC alloy and a stack structure of an APC alloy and ITO (ITO/APC/ITO).

The light-receiving semiconductor layer PSEM may be disposed on the first sensing electrode PCE. The light receiving semiconductor layer PSEM may have a PIN structure in which a p-type semiconductor layer PL, an i-type semiconductor layer IL, and an p-type semiconductor layer NL are stacked on one another sequentially. When the light-receiving semiconductor layer PSEM has the PIN structure, the i-type semiconductor layer IL is depleted by the p-type semiconductor layer PL and the n-type semiconductor layer NL so that an electric field is generated therein. The holes and electrons generated by sunlight are drifted by the electric field. Thus, the holes may be collected to the second sensing electrode PAE through the p-type semiconductor layer PL, while the electrons may be collected to the first sensing electrode PCE through the n-type semiconductor layer NL.

The p-type semiconductor layer PL may be disposed closer to the surface on which the external light is incident, and the n-type semiconductor layer NL may be disposed farther from the surface on which the external light is incident. Since the drift mobility of the holes is lower than the drift mobility of the electrons, it is preferable to form the p-type semiconductor layer PL closer to the surface on which the external light is incident in order to increase the collection efficiency by the incident light.

The n-type semiconductor layer NL may be disposed on the first sensing electrode PCE, the i-type semiconductor layer IL may be disposed on the n-type semiconductor layer NL, and the p-type semiconductor layer PL may be disposed on the i-type semiconductor layer IL. In such case, the p-type semiconductor layer PL may be formed by doping amorphous silicon (a-Si: H) with a p-type dopant. The i-type semiconductor layer IL may be made of amorphous silicon germanium (a-SiGe: H) or amorphous silicon carbide (a-SiC: H). The n-type semiconductor layer NL may be formed by doping amorphous silicon germanium (a-SiGe: H) or amorphous silicon carbide (a-SiC: H) with an n-type dopant. The p-type semiconductor layer PL and the n-type semiconductor layer NL may be formed to have a thickness of approximately 500 Å, and the i-type semiconductor layer IL may be formed to have a thickness of 5,000 Å to 10,000 Å.

Alternatively, the n-type semiconductor layer NL may be disposed on the first sensing electrode PCE, the i-type semiconductor layer IL may be omitted, and the p-type semiconductor layer PL may be disposed on the n-type semiconductor layer NL. In such case, the p-type semiconductor layer PL may be formed by doping amorphous silicon (a-Si: H) with a p-type dopant. The n-type semiconductor layer NL may be formed by doping amorphous silicon germanium (a-SiGe: H) or amorphous silicon carbide (a-SiC: H) with an n-type dopant. The p-type semiconductor layer PL and the n-type semiconductor layer NL may be formed to having the thickness of 500 Å.

In addition, the upper surface or lower surface of at least one of the first sensing electrode PCE, the p-type semiconductor layer PL, the i-type semiconductor layer IL, the n-type semiconductor layer NL and the second sensing electrode PAE may be formed to have uneven structure via a texturing process in order to increase the efficiency of absorbing external light. The texturing process is a process of forming a material surface into an uneven structure, like the surface of fabric. The texturing process may be carried out via an etching process using photolithography, an anisotropic etching using chemical solution, or a groove forming process using mechanical scribing.

The second sensing electrode PAE may be disposed on the p-type semiconductor layer PL. The second sensing electrode PAE may be made of a transparent conductive material (TCO) that can transmit light, such as ITO and IZO.

A second insulating layer INS2 may be disposed on the light sensing element PD and the second fingerprint capacitor electrode FCE2. The second insulating layer INS2 may be formed of an inorganic layer, for example, a silicon nitride layer, a silicon oxynitride layer, a silicon oxide layer, a titanium oxide layer, or an aluminum oxide layer. The second insulating layer INS2 may include a number of inorganic layers.

A first connection electrode CE1, a second connection electrode CE2, and a third connection electrode CE3 may be disposed on the second insulating layer INS2.

The first connection electrode CE1 may be connected to the second source electrode S2 of the second thin-film transistor ST2 through a source contact hole SCT that penetrates through the first insulating layer INS1 and the second insulating layer INS2 to expose the second source electrode S2 of the second thin-film transistor ST2.

The second connection electrode CE2 may be connected to the second drain electrode D2 of the second thin-film transistor ST2 through a drain contact hole DCT that penetrates through the first insulating layer INS1 and the second insulating layer INS2 to expose the second drain electrode D2 of the second thin-film transistor ST2. The second connection electrode CE2 may be connected to the first sensing electrode PCE through a first sensing contact hole RCT1 that penetrates the second insulating layer INS2 to expose the first sensing electrode PCE. Accordingly, the drain electrode D2 of the second thin-film transistor ST2 and the first sensing electrode PCE of the light sensing element PD may be connected by the second connection electrode CE2.

The third connection electrode CE3 may be connected to the second sensing electrode PAE through a second sensing contact hole RCT2 that penetrates the second insulating layer INS2 to expose the second sensing electrode PAE.

The first connection electrode CE1, the second connection electrode CE2 and the third connection electrode CE3 may be made up of a single layer or multiple layers of one of molybdenum (Mo), aluminum (Al), chromium (Cr), gold (Au), titanium (Ti), nickel (Ni), neodymium (Nd) and/or copper (Cu) or an alloy thereof.

A third insulating layer INS3 may be disposed on the first connection electrode CE1, the second connection electrode CE2 and the third connection electrode CE3. The third insulating layer INS3 may be formed of an inorganic layer, for example, a silicon nitride layer, a silicon oxynitride layer, a silicon oxide layer, a titanium oxide layer, or an aluminum oxide layer. The third insulating layer INS3 may include a number of inorganic layers. The third insulating layer INS3 may be omitted.

A planarization layer PLA may be disposed on the third insulating layer INS3. The planarization layer PLA may be formed of an organic layer such as an acryl resin, an epoxy resin, a phenolic resin, a polyamide resin and a polyimide resin.

The light guide layer 420 may include first light-transmitting films LT1, a second light-transmitting film LT2, and a light-blocking layer LS.

The first light-transmitting films LT1 may be disposed on the planarization layer PLA of the fingerprint sensing layer 410. The first light-transmitting films LT1 may be spaced apart from one another. The first light-transmitting films LT1 may be arranged in the first direction (x-axis direction) with a first spacing and may be arranged in the second direction (y-axis direction) with a second spacing. The first spacing may be, but is not necessarily limited to being, equal to the second spacing. For example, the first light-transmitting films LT1 may be arranged at approximately every 4 µm in the first direction (x-axis direction) and the second direction (y-axis direction). It is, however, to be understood that the present disclosure is not necessarily limited thereto.

The width of the first light-transmitting film LT1 may be, but is not necessarily limited to, approximately 1 µm to 2 µm. The width of the first light-transmitting film LT1 may be the length of the first light-transmitting film LT1 in the first direction (x-axis direction) or the second direction (y-axis direction). The length of the first light-transmitting film LT1 in the third direction (z-axis direction) may be several µm (e.g. 2 µm to 15 µm) or more. For example, the length of the first light-transmitting film LT1 in the third direction (z-axis direction) may be 5 µm or more. The first light-transmitting film LT1 may have a circular column, an elliptical column, or a polygonal column such as a square column.

The first light-transmitting film LT1 may be formed of an organic layer such as an acryl resin, an epoxy resin, a phenolic resin, a polyamide resin and a polyimide resin.

The second light-transmitting film LT2 may be disposed on the first light-transmitting films LT1. The second light-transmitting film LT2 may be disposed on the upper surface and at least two opposing side surfaces of each of the first light-transmitting films LT1. The second light-transmitting film LT2 may be disposed on the planarization layer PLA between the first light-transmitting films LT1.

The second light-transmitting film LT2 may be made of a different material from the first light-transmitting film LT1. The refractive index of the second light-transmitting film LT2 may be substantially equal to the refractive index of the first light-transmitting film LT1. Alternatively, the second light-transmitting film LT2 may have a refractive index that is lower than that of the first light-transmitting film LT1. The second light-transmitting film LT2 may be formed as an inorganic film. In order to make the refractive index of the second light-transmitting film LT2 substantially equal to or less than the refractive index of the first light-transmitting film LT1, the second light-transmitting film LT2 may be made of a silicon oxynitride layer or a silicon oxide layer.

The light-blocking film LS may be disposed between the first light-transmitting films LT1. The light-blocking film LS may be disposed between one of the first light-transmitting films LT1 and another one which are adjacent to each other in the first direction (x-axis direction). In addition, the light-blocking film LS may be disposed between one of the first light-transmitting films LT1 and another one which are adjacent to each other in the second direction (y-axis direction).

Since the second light-transmitting film LT2 is disposed on the side surfaces of each of the first light-transmitting film LT1, the side surfaces of the light-blocking film LS may be at least partially surrounded by the second light-transmitting film LT2. In addition, the second light-transmitting film LT2 may be disposed on the lower surface of the light-blocking film LS. The upper surface of the second light-transmitting film LT2 and the upper surface of the light-blocking film LS may be flat.

The width of the first light-blocking film LS may be, but is not necessarily limited to, approximately 1 μm to 1.5 μm. The width of the light-blocking film LS may be the length of the light-blocking film LS in the first direction (x-axis direction) or the second direction (y-axis direction).

The width of the second light-transmitting film LT2 may be, but is not necessarily limited to, approximately 0.5 μm to 1 μm. The width of the second light-transmitting film LT2 may be the length of the second light-transmitting film LT2 disposed between the first light-transmitting film LT1 and the light-blocking film LS in the first direction (x-axis direction) or the second direction (y-axis direction).

The light-blocking film LS may be formed of a photo-sensitive resin capable of blocking light. For example, the light-blocking film LS may include an inorganic black pigment such as carbon black or an organic black pigment.

Each of the openings OA of the light guide layer 420 may be defined as an area where no light-blocking film LS is disposed, and the light-blocking area LSA may be defined as an area where the light-blocking film LS is disposed. The first light-transmitting film LT1 and the second light-transmitting film LT2 are disposed in each of the openings OA. Since the light sensing element PD overlaps the plurality of openings OA in the third direction (z-axis direction), light can be incident on the light sensing element PD of the sensor pixel SP through the openings OA.

A transparent adhesive member 430 may be disposed on the light guide layer 420. The transparent adhesive member 430 may be attached to the upper surface of the light guide layer 420 and the lower surface of the display panel 100. The refractive index of the transparent adhesive member 430 may be higher than that of the first light-transmitting film LT1.

Figure 6:
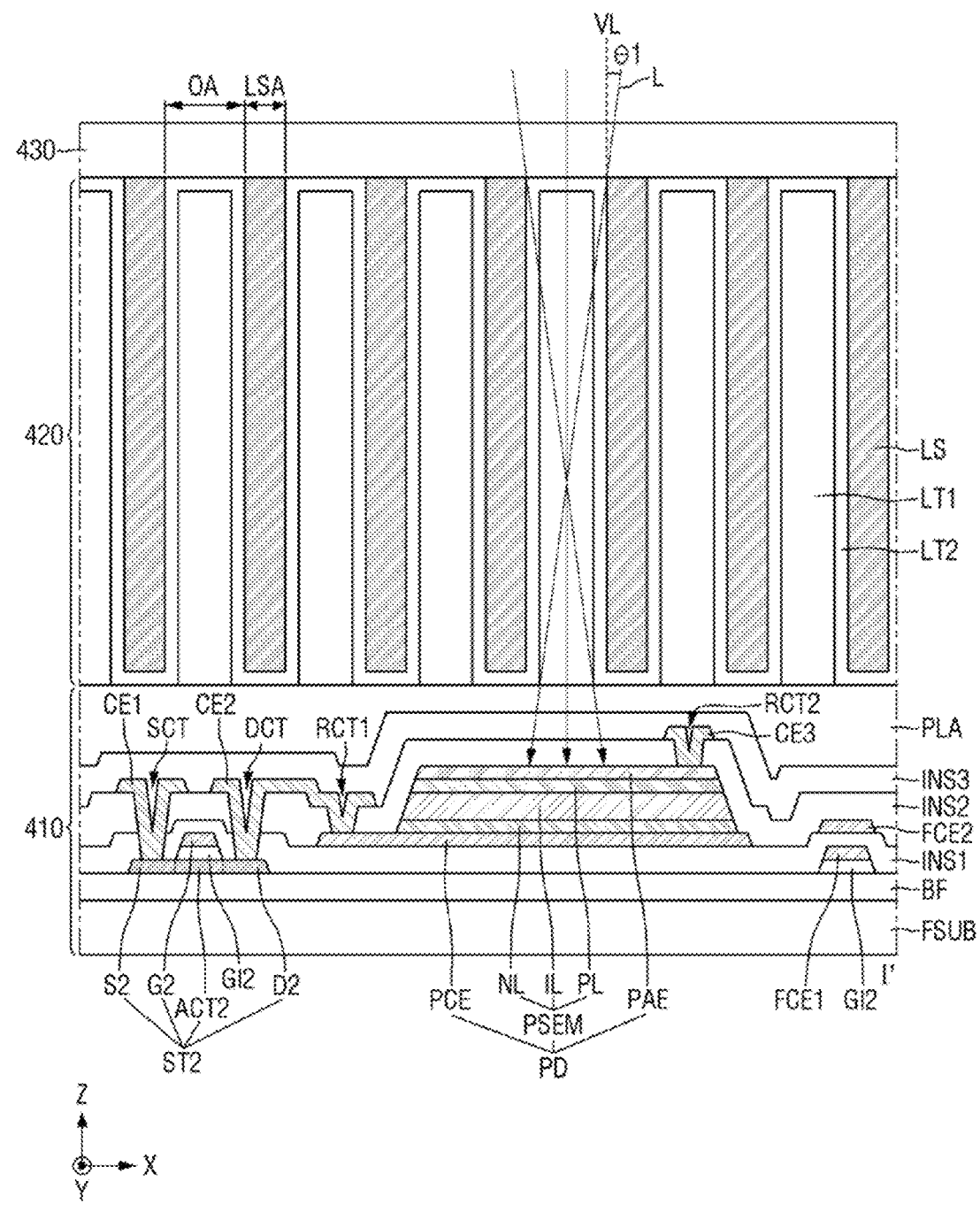
FIGS. 6 to 8 are exemplary views illustrating light propagation directions according to the refractive index of the first light-transmitting layer and the refractive index of the second light-transmitting layer in FIG. 5.
Figure 7:
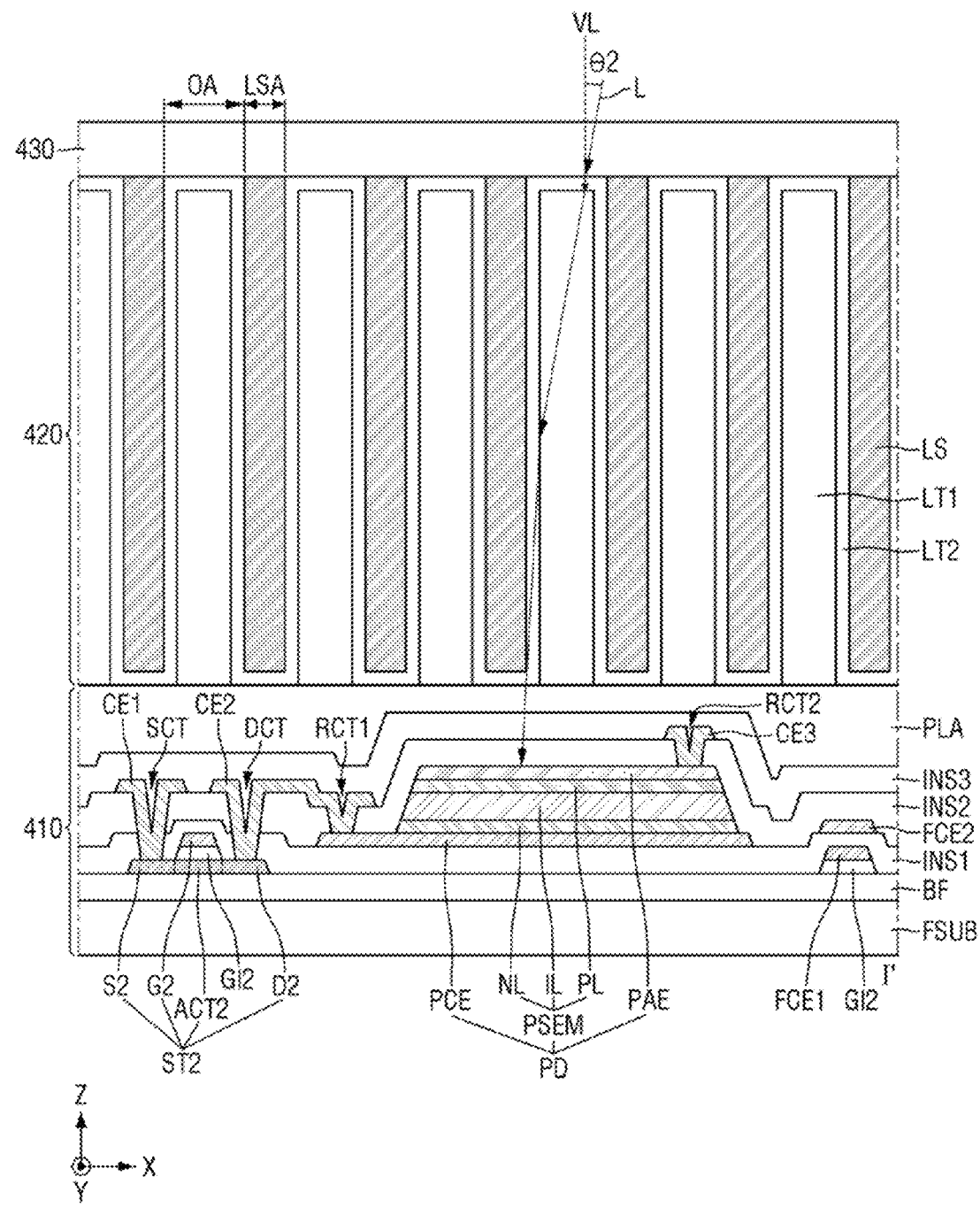
Figure 8:
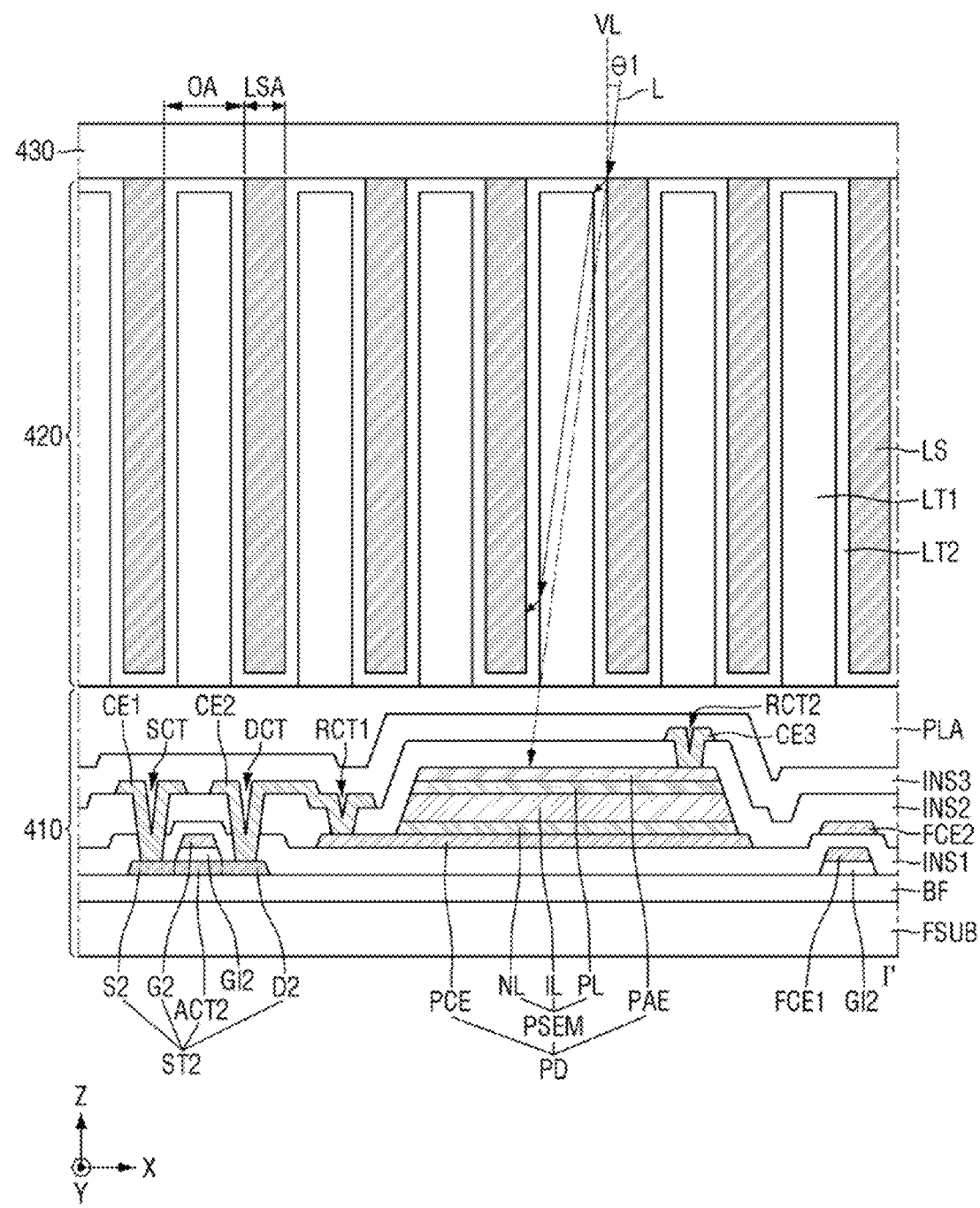

FIGS. 6 to 8 are exemplary views showing light propagation paths according to the refractive index of the first light-transmitting film and the refractive index of the second light-transmitting film in FIG. 5.

FIG. 6 shows a path of the light incident on an opening OA of the light guide layer 420 when the refractive index of the first light-transmitting film LT1 is substantially equal to that of the second light-transmitting film LT2. FIG. 7 shows a path of the light incident on an opening OA of the light guide layer 420 when the refractive index of the first light-transmitting film LT1 is higher than that of the second light-transmitting film LT2. FIG. 8 shows a path of the light incident on an opening OA of the light guide layer 420 when the refractive index of the first light-transmitting film LT1 is lower than that of the second light-transmitting film LT2.

Referring to FIG. 6, when the refractive index of the first light-transmitting film LT1 is substantially equal to that of the second light-transmitting film LT2, light L entering the opening OA might not be refracted but may be incident on the light sensing element PD of the fingerprint sensing layer 410. If light L entering the opening OA has a first angle θ1 or less, the light L can pass through the opening OA. The angle of the light L entering the opening OA is measured from the normal VL to the upper surface of the opening OA. Therefore, it is possible to suppress noise light incident on the light sensing element PD through the opening OA.

Referring to FIG. 7, when the refractive index of the first light-transmitting film LT1 is higher than that of the second light-transmitting film LT2, the light L entering the opening OA may be refracted at the boundary between the transparent adhesive member 430 and the second light-transmitting film LT2 and the boundary between the first light-transmitting film LT1 and the second light-transmitting film LT2. For example, when the angle of the light L entering the opening OA is a second angle θ2 greater than the first angle θ1, the light L may be refracted at the boundary between the transparent adhesive member 430 and the second light-transmitting film LT2, may be refracted at the boundary between the second light-transmitting film LT2 and the first light-transmitting film LT1, and may be refracted at the first light-transmitting film LT1 and the second light-transmitting film LT2. Therefore, light L entering the opening OA at the second angle θ2 may pass through the opening OA. Therefore, the amount of light L incident on the light sensing element PD through the opening OA in the exemplary embodiment of FIG. 7 can be increased compared to the exemplary embodiment of FIG. 6.

Referring to FIG. 8, when the refractive index of the first light-transmitting film LT1 is lower than that of the second light-transmitting film LT2, the light L entering the opening OA may be refracted at the boundary between the transparent adhesive member 430 and the second light-transmitting film LT2 and the boundary between the first light-transmitting film LT1 and the second light-transmitting film LT2. For example, when the angle of the light L entering the opening OA is the first angle θ1, the light L may be refracted at the boundary between the transparent adhesive member 430 and the second light-transmitting film LT2, may be refracted at the boundary between the second light-transmitting film LT2 and the first light-transmitting film LT1, and may be refracted at the first light-transmitting film LT1 and the second light-transmitting film LT2. Therefore, light L entering the opening OA at the first angle θ1 might not pass through the opening OA.

In view of the above, when the refractive index of the first light-transmitting film LT1 is substantially equal to that of the second light-transmitting film LT2, it is possible to reduce light that may be sensed as noise among light incident on the light sensing element PD. Therefore, the fingerprint of the finger F can be recognized more accurately. In addition, when the refractive index of the first light-transmitting film LT1 is lower than that of the second light-transmitting film LT2, the amount of light incident on the light sensing element PD through the opening OA can be increased.

Figure 9:
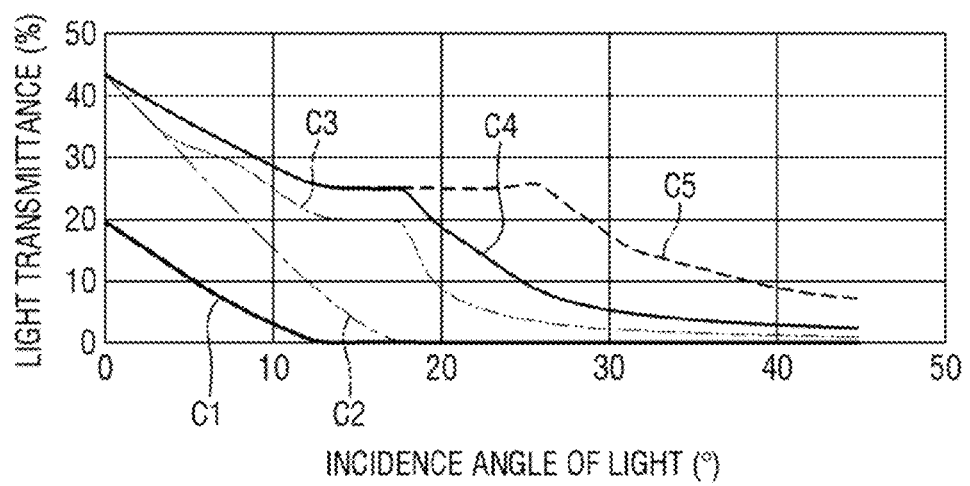
FIG. 9 is a graph illustrating the light transmittance of the opening versus the incidence angle of light for different refractive indexes of the second light-transmitting layer.

FIG. 9 is a graph showing the light transmittance of the opening versus the incidence angle of light for different refractive indexes of the second light-transmitting film.

In the graph shown in FIG. 9, the x-axis represents the incidence angle, and the y-axis represents the light transmittance of the opening OA. The incidence angle refers to the angle of light entering the opening OA. The light transmittance of the opening OA refers to a ratio of light passing through the opening OA to light entering in the opening OA.

In the graph of FIG. 9, a first curve C1 shows an example where the width of the first light-transmitting film LT1 is 2 µm, the second light-transmitting film LT2 is omitted, and the width of the light-blocking film LS is 2 µm. Second to fifth curves C2 to C5 show examples where the width of the first light-transmitting film LT1 is 2 µm, the width of the second light-transmitting film LT2 is 1 µm, and the width of the light-blocking film LS is 1 µm. Each of the first to fifth curves C1 to C5 shows an example where the refractive index of the first light-transmitting film LT1 is 1.5. The second curve C2 shows an example where the refractive index of the second light-transmitting film LT2 may be 1.5, and the third curve C3 shows an example where the refractive index of the second light-transmitting film LT2 may be 1.4. The fourth curve C4 shows an example where the refractive index of the second light-transmitting film LT2 may be 1.6, and the fifth curve C5 shows an example where the refractive index of the second light-transmitting film LT2 may be 1.7.

Referring to FIG. 9, in the example indicated by the first curve C1, light having an incidence angle of approximately 13 degrees or less may pass through the opening OA. In addition, in the example indicated by the first curve C1, the light transmittance may be 20% or less at the incidence angle of 0 degree.

In the example indicated by the second curve C2, the transmittance of light is 43% at the incidence angle of 0 degree, and the transmittance of light may be 10% or more at the incidence angle of 0 degree to 13 degrees. Therefore, in the example indicated by the second curve C2, the light transmittance of the opening OA can be increased compared to the example indicated by the first curve C1. In addition, in the example indicated by the second curve C2, since the light having an incidence angle of approximately 17 degrees or less passes through the opening OA, it is possible to suppress an increase in noise light incident on the light sensing element PD.

In the example indicated by the third curve C3, the transmittance of light is 43% at the incidence angle of 0 degree, and the transmittance of light may be 20% or more at the incidence angle of 0 degree to 17 degrees. Therefore, in the example indicated by the third curve C3, the light transmittance of the opening OA can be increased compared to the example indicated by the second curve C2. However, in the example indicated by the third curve C3, the light transmittance at the incidence angle of 20 degrees is 5%, and thus the incidence angle of light passing through the opening OA can be increased compared to the example indicated by the second curve C2.

In the example indicated by the fourth curve C4, since the transmittance of light is 10% or more at the incidence angle of 25 degrees, noise light incident on the light sensing element PD may increase.

In the example indicated by the fifth curve C5, since the transmittance of light is 25% or more at the incidence angle of 25 degrees, noise light incident on the light sensing element PD may increase.

In view of the above, as in the example indicated by the second curve C2, even if the width of the opening OA is longer than the width of the light-blocking area LSA, when the refractive index of the first light-transmitting film LT1 is substantially equal to that of the second light-transmitting film LT2, the transmittance of light in the opening OA can be increased, and it is possible to suppress noise light incident on the light sensing element PD.

In addition, as in the example indicated by the third curve C3, when the width of the opening OA is longer than the width of the light-blocking area LSA and the refractive index of the first light-transmitting film LT1 is larger than that of the second light-transmitting film LT2, the transmittance of light in the opening OA can be increased.

Figure 10:
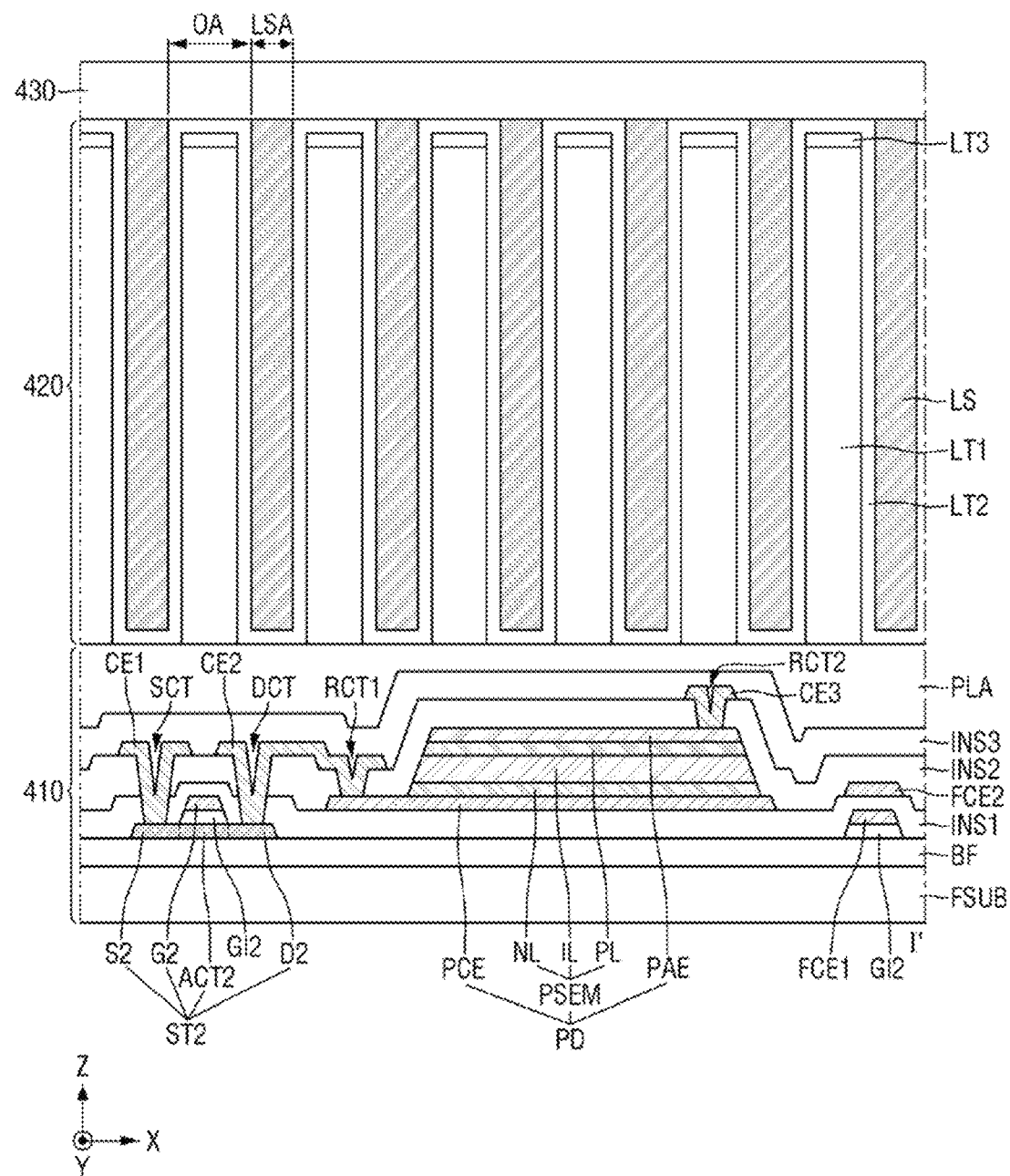
FIG. 10 is an enlarged, cross-sectional view illustrating an example of the fingerprint sensor of area A of FIG. 3.

FIG. 10 is an enlarged, cross-sectional view illustrating an example of the fingerprint sensor of area A of FIG. 3.

The exemplary embodiment of FIG. 10 is different from the exemplary embodiment of FIG. 5 in that a third light-transmitting film LT3 is further disposed between the upper surface of the first light-transmitting film LT1 and the second light-transmitting film LT2. Accordingly, FIG. 10 will be described primarily by the differences of what is shown in FIG. 5 and to the extent that elements shown in FIG. 10 are not described herein, it may be assumed that these elements are at least similar to those described herein with respect to FIG. 5 or elsewhere within the specification.

Referring to FIG. 10, the third light-transmitting film LT3 may be disposed on the first light-transmitting film LT1. The second light-transmitting film LT2 may be made of a material different from the materials of the first light-transmitting film LT1 and the second light-transmitting film LT2. The third light-transmitting film LT3 may be an organic film or an inorganic film. For example, when the third light-transmitting film LT3 is an organic film, it may be a photoresist. When the third light-transmitting film LT3 is an inorganic film, it may be transparent conductive oxide (TCO). For example, when the third light-transmitting film LT3 is an inorganic film, it may be indium tin oxide (ITO) or indium zinc oxide (IZO).

The refractive index of the third light-transmitting film LT3 may be substantially equal to the refractive index of the first light-transmitting film LT1. In such case, noise light incident on the light sensing element PD through the opening OA can be reduced, as described above with reference to FIGS. 6 and 9.

Alternatively, the third light-transmitting film LT3 may have a refractive index lower than that of the first light-transmitting film LT1. In such case, the amount of light incident on the light sensing element PD through the opening OA can be increased, as described above with reference to FIGS. 7 and 9.

Figure 11:
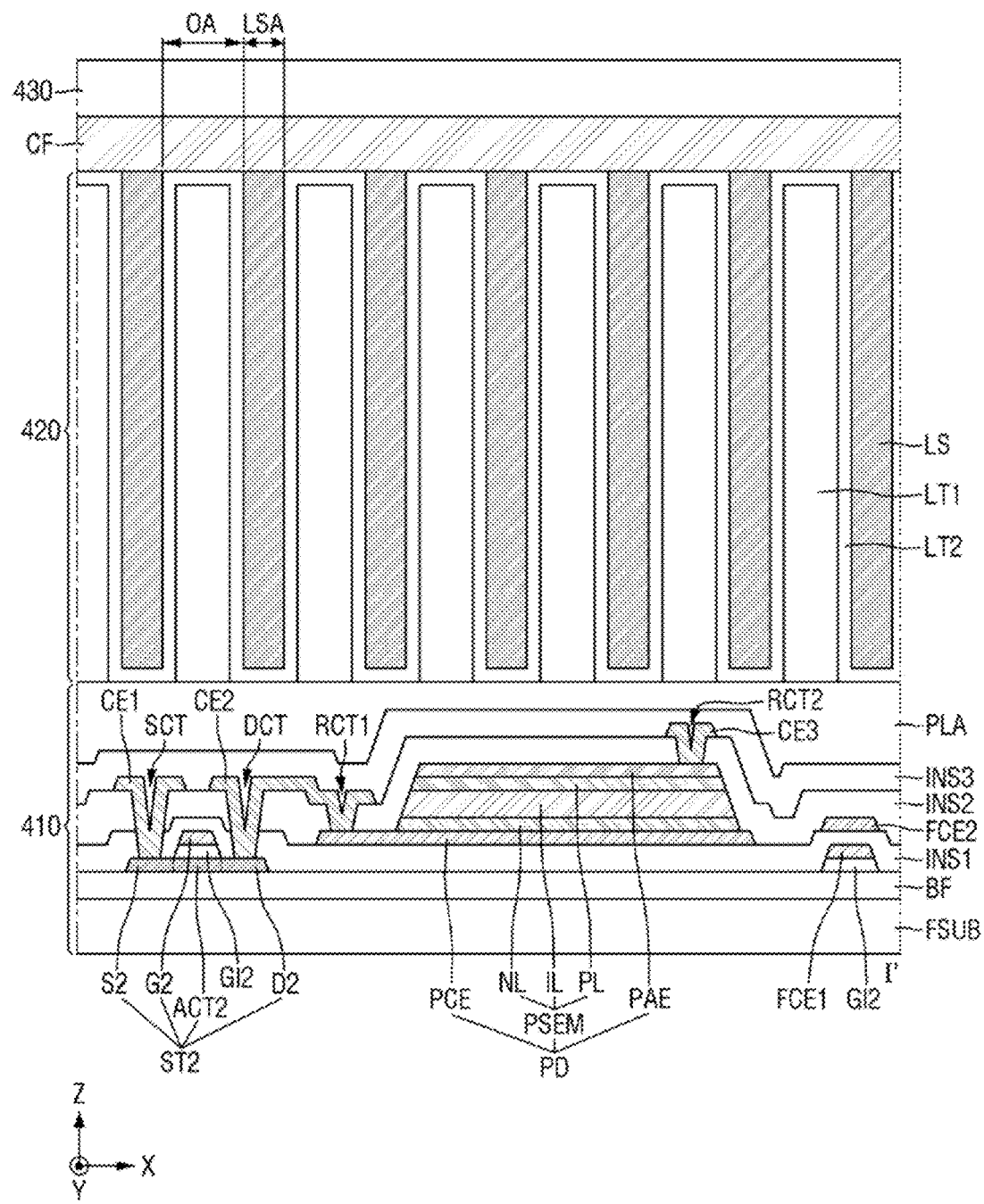
FIG. 11 is an enlarged, cross-sectional view illustrating an example of the fingerprint sensor of area A of FIG. 3.

FIG. 11 is an enlarged, cross-sectional view illustrating an example of the fingerprint sensor of area A of FIG. 3.

The exemplary embodiment of FIG. 11 is different from the exemplary embodiment of FIG. 5 in that a color filter CF is disposed on a second light-transmitting film LT2 and a light-blocking film LS. Accordingly, FIG. 11 will be described primarily by the differences of what is shown in FIG. 5 and to the extent that elements shown in FIG. 11 are not described herein, it may be assumed that these elements are at least similar to those described herein with respect to FIG. 5 or elsewhere within the specification Referring to FIG. 11, the color filter CF may allow light in a particular wavelength band to pass therethrough. For example, the color filter CF may be a green color filter that allows light in a wavelength band of 490 nm to 570 nm corresponding to green light to pass therethrough. Alternatively, the color filter CF may be a cyan color filter that allows light in a wavelength band of 490 nm to 570 nm and light in a wavelength band of 450 nm to 480 nm corresponding to blue light to pass therethrough.

Since the light output from the display panel 100 does not include infrared light, infrared light is a kind of external noise light. Therefore, infrared light may be blocked. When a color filter CF such as a green color filter and a cyan color filter is disposed on the second light-transmitting film LT2 and the light-blocking film LS, infrared light does not pass through the color filter CF, so that it is possible to block infrared light incident on the light sensing element PD.

Figure 12:
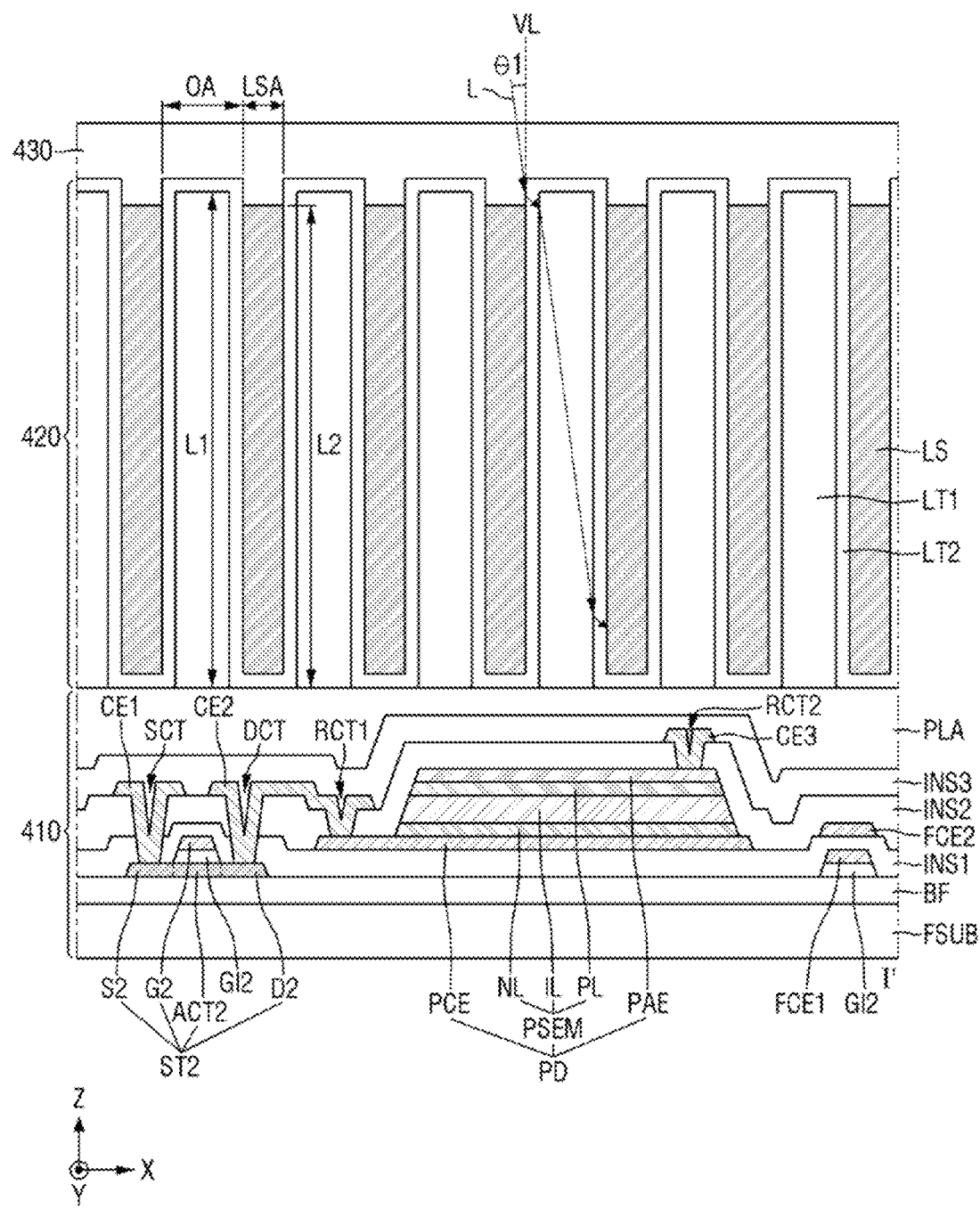
FIG. 12 is an enlarged, cross-sectional view illustrating an example of the fingerprint sensor of area A of FIG. 3.

FIG. 12 is an enlarged, cross-sectional view illustrating an example of the fingerprint sensor of area A of FIG. 3.

The exemplary embodiment of FIG. 12 is different from the exemplary embodiment of FIG. 5 in that a length L2 of a light-blocking film LS in the third direction (z-axis direction) is smaller than a length L1 of a first light-transmitting film LT1 in the third direction (z-axis direction). Accordingly, FIG. 12 will be described primarily by the differences of what is shown in FIG. 5 and to the extent that elements shown in FIG. 12 are not described herein, it may be assumed that these elements are at least similar to those described herein with respect to FIG. 5 or elsewhere within the specification Referring to FIG. 12, when the length L2 of the light-blocking film LS in the third direction (z-axis direction) is smaller than the length L1 of the first light-transmitting film LT1 in the third direction (z-axis direction), a transparent adhesive member 430 may be disposed on the upper surface of the light-blocking film LS and the side surfaces of the second light-transmitting film LT2. When the refractive index of the first light-transmitting film LT1 is substantially equal to the refractive index of the second light-transmitting film LT2 or the refractive index of the first light-transmitting film LT1 is greater than the refractive index of the second light-transmitting film LT2, the refractive index of the transparent adhesive member 430 may be greater than that of the second light-transmitting film LT2. Accordingly, the refraction angle of light L incident on the side surfaces of the second light-transmitting film LT2 may be greater than the incidence angle. For example, as shown in FIG. 12, light entering the opening OA at a second angle θ2 greater than the first angle θ1 might not pass through the opening OA. Therefore, it is possible to reduce the light L that can be sensed as noise among the light incident on the light sensing element PD.

Figure 13:
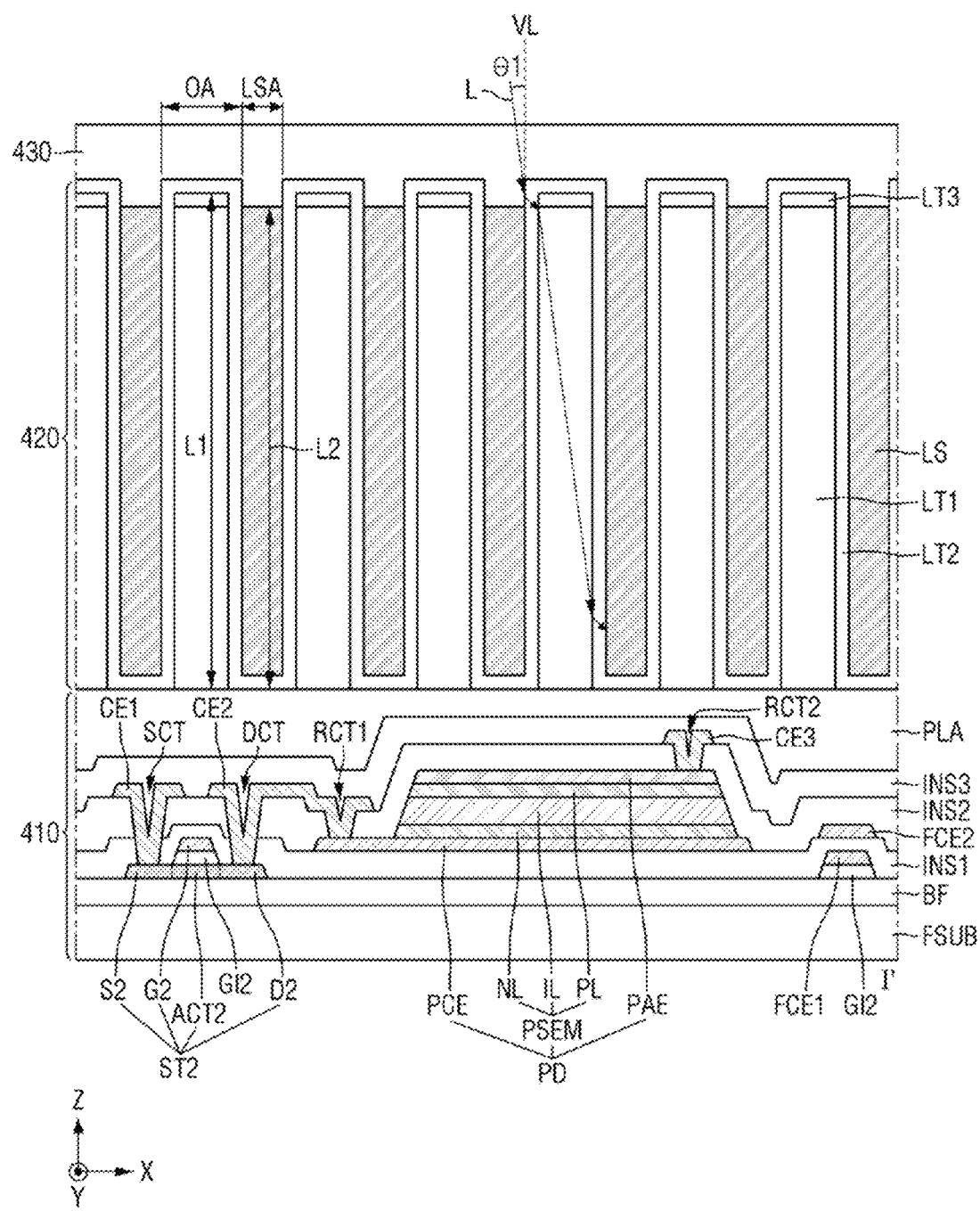
FIG. 13 is an enlarged, cross-sectional view illustrating an example of the fingerprint sensor of area A of FIG. 3.

FIG. 13 is an enlarged, cross-sectional view illustrating an example of the fingerprint sensor of area A of FIG. 3.

The exemplary embodiment of FIG. 13 is different from the exemplary embodiment of FIG. 12 in that a third light-transmitting film LT3 is further disposed between the upper surface of the first light-transmitting film LT1 and the second light-transmitting film LT2. Accordingly, FIG. 13 will be described primarily by the differences of what is shown in FIG. 12 and to the extent that elements shown in FIG. 13 are not described herein, it may be assumed that these elements are at least similar to those described herein with respect to FIG. 12 or elsewhere within the specification Referring to FIG. 13, the third light-transmitting film LT3 may be disposed on the first light-transmitting film LT1. The second light-transmitting film LT2 may be made of a material different from the materials of the first light-transmitting film LT1 and the second light-transmitting film LT2. The third light-transmitting film LT3 may be an organic film or an inorganic film. For example, when the third light-transmitting film LT3 is an organic film, it may be a photoresist. When the third light-transmitting film LT3 is an inorganic film, it may be transparent conductive oxide (TCO). For example, when the third light-transmitting film LT3 is an inorganic film, it may be indium tin oxide (ITO) or indium zinc oxide (IZO).

The refractive index of the third light-transmitting film LT3 may be substantially equal to the refractive index of the first light-transmitting film LT1. In such case, noise light incident on the light sensing element PD through the opening OA can be reduced, as described above with reference to FIGS. 6 and 9.

Alternatively, the third light-transmitting film LT3 may have a refractive index lower than that of the first light-transmitting film LT1. In such case, the amount of light incident on the light sensing element PD through the opening OA can be increased, as described above with reference to FIGS. 7 and 9.

Figure 14:
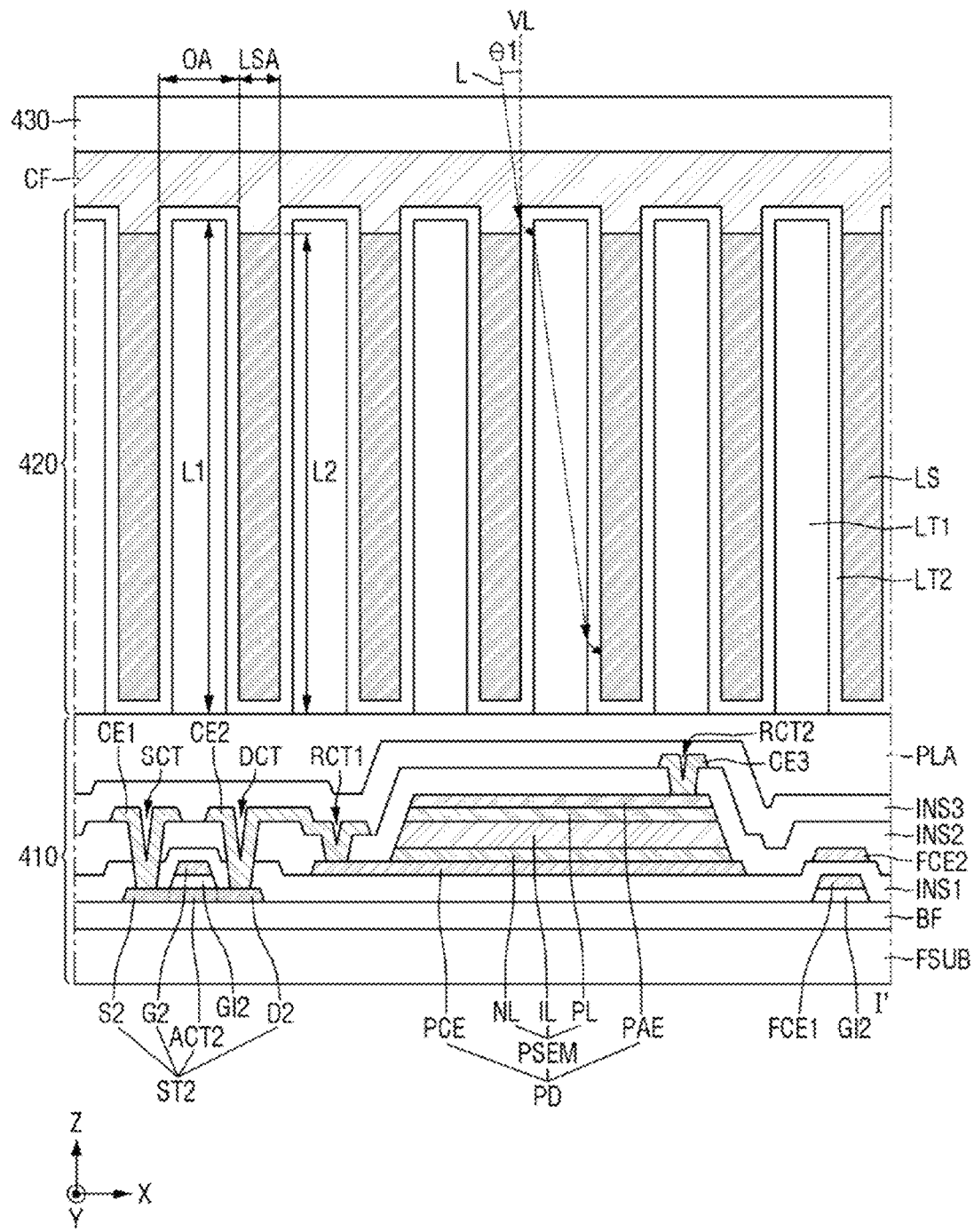
FIG. 14 is an enlarged, cross-sectional view illustrating an example of the fingerprint sensor of area A of FIG. 3.

FIG. 14 is an enlarged, cross-sectional view illustrating an example of the fingerprint sensor of area A of FIG. 3.

The exemplary embodiment of FIG. 14 is different from the exemplary embodiment of FIG. 12 in that a color filter CF is disposed on a second light-transmitting film LT2 and a light-blocking film LS. Accordingly, FIG. 14 will be described primarily by the differences of what is shown in FIG. 12 and to the extent that elements shown in FIG. 14 are not described herein, it may be assumed that these elements are at least similar to those described herein with respect to FIG. 12 or elsewhere within the specification Referring to FIG. 14, the color filter CF may allow light in a particular wavelength band to pass therethrough. For example, the color filter CF may be a green color filter that allows light in a wavelength band of 490 nm to 570 nm corresponding to green light to pass therethrough. Alternatively, the color filter CF may be a cyan color filter that allows light in a wavelength band of 490 nm to 570 nm and light in a wavelength band of 450 nm to 480 nm corresponding to blue light to pass therethrough.

Since the light output from the display panel 100 does not include infrared light, infrared light is a kind of external noise light. Therefore, infrared light may be blocked. When a color filter CF such as a green color filter and a cyan color filter is disposed on the second light-transmitting film LT2 and the light-blocking film LS, infrared light does not pass through the color filter CF, so that it is possible to block infrared light incident on the light sensing element PD.

Figure 15:
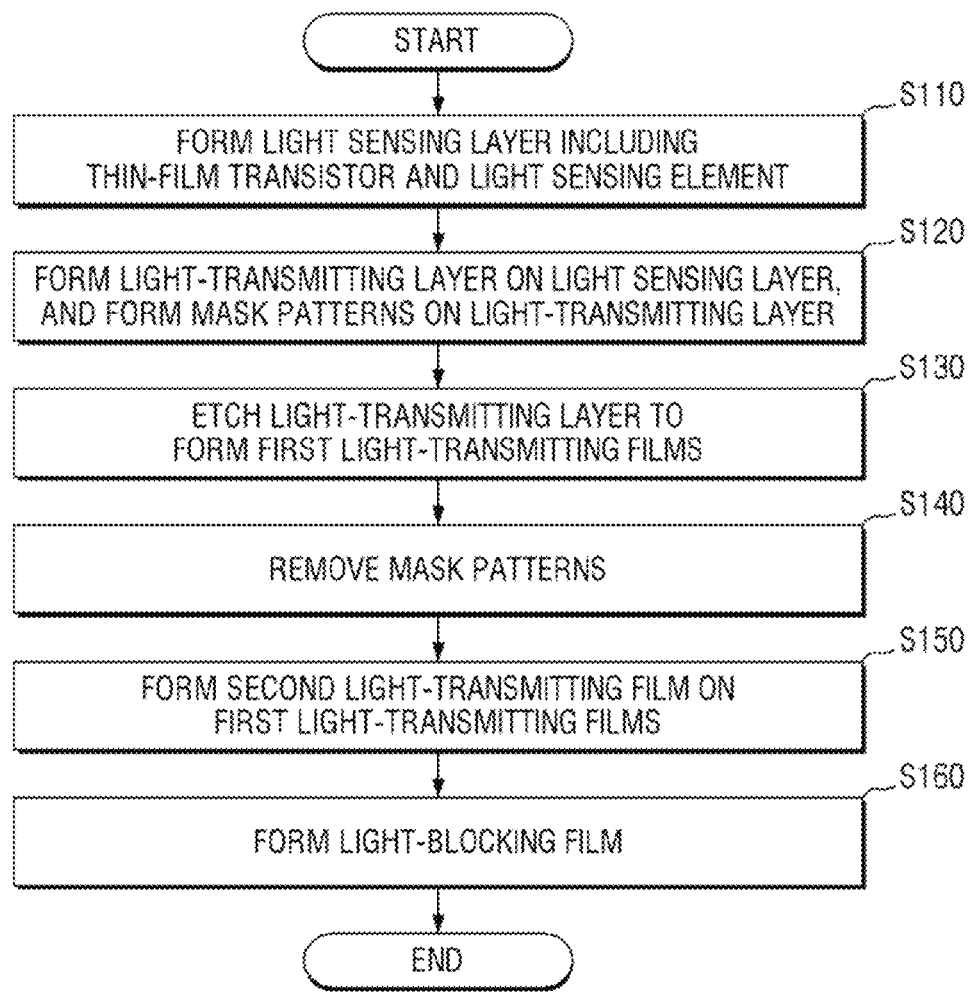
FIG. 15 is a flowchart illustrating a method of fabricating a fingerprint sensor according to an exemplary embodiment of the present disclosure.

FIG. 15 is a flowchart illustrating a method of fabricating a fingerprint sensor according to an exemplary embodiment of the present disclosure. FIGS. 16 to 21 are cross-sectional views illustrating a method of fabricating the fingerprint sensor of FIG. 15.

Hereinafter, a method of fabricating a fingerprint sensor according to an exemplary embodiment will be described in detail with reference to FIGS. 16 to 21.

Initially, a fingerprint sensing layer 410 including a second thin-film transistor ST2 and a light sensing element PD is formed (step S110 of FIG. 13).

Figure 16:
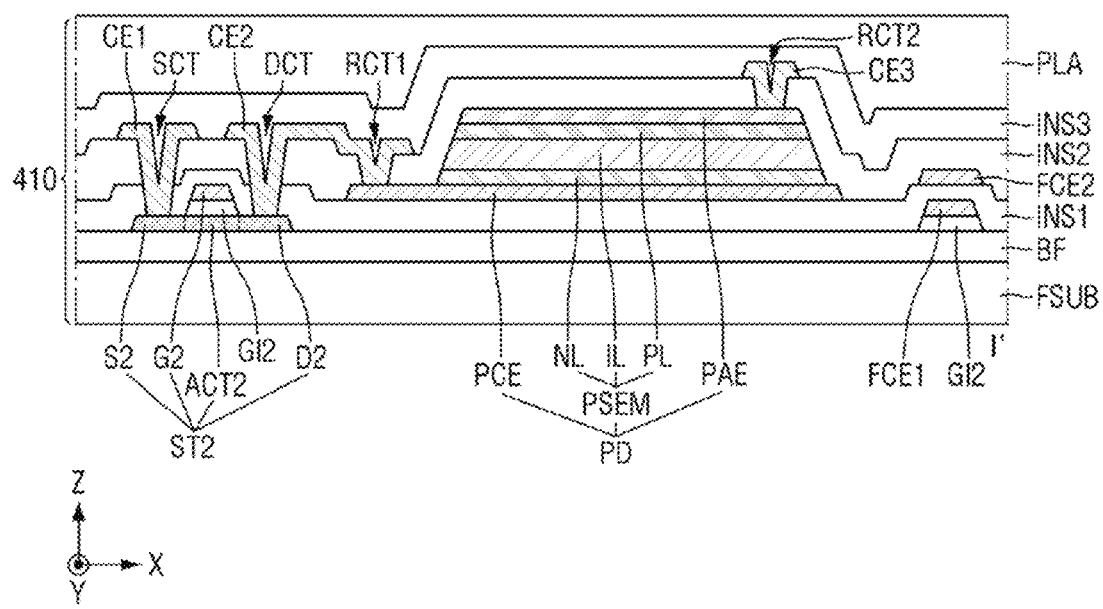
FIGS. 16 to 21 are cross-sectional views illustrating a method of fabricating the fingerprint sensor of FIG. 15.

Referring to FIG. 16, an inorganic material is deposited on a fingerprint sensor substrate FSUB to form a buffer layer BF.

A second active layer ACT2 of a second thin-film transistor ST2 is formed on the buffer layer BF by using a photolithography process.

An inorganic material is deposited on the second active layer ACT2 of the second thin-film transistor ST2 to form a second gate insulating layer GI2.

A second gate electrode G2 and a first fingerprint capacitor electrode FCE1 of the second thin-film transistor ST2 may be formed on the second gate insulating layer GI2 using a photolithography process. In doing so, since the second gate insulating layer GI2 is etched using the second gate electrode G2 of the second thin-film transistor ST2 as a mask, the second gate insulating layer GI2 may be disposed between the second gate electrode G2 and the second active layer ACT2 of the second thin-film transistor ST2 and between the first fingerprint capacitor electrode FCE1 and the buffer layer BF. In addition, since the second active layer ACT2 of the second thin-film transistor ST2 is not covered by the second gate insulating layer GI2 but is exposed is doped with impurities or ions, it can have a desired conductivity. Therefore, the second source electrode S2 and the second drain electrode D2 of the second thin-film transistor ST2 having a desired conductivity may be formed.

An inorganic material is deposited on the second gate electrode G2, the second source electrode S2 and the second drain electrode D2 of the second thin-film transistor ST2 and the first fingerprint capacitor electrode FCE1 to form a first insulating layer INS1.

A first sensing electrode PCE and a second fingerprint capacitor electrode FCE2 of the light sensing element PD are formed on the first insulating layer INS1 using a photolithography process. A sensing semiconductor layer PSEM and a second sensing electrode PAE are formed on the first sensing electrode PCE by using a photolithography process.

An inorganic material is deposited on the light sensing element PD and the second fingerprint capacitor electrode FCE2 to form a second insulating layer INS2.

A source contact hole SCT, a drain contact hole DCT, a first sensing contact hole RCT1 and a second sensing contact hole RCT2 are formed in the second insulating layer INS2 via a photolithography process. The source contact hole SCT and the drain contact hole DCT may be formed by removing the first insulating layer INS1 and the second insulating layer INS2. The first sensing contact hole RCT1 and the second sensing contact hole RCT2 may be formed by removing the second insulating layer INS2.

A first connection electrode CE1, a second connection electrode CE2 and a third connection electrode CE3 may be formed on the second insulating layer INS2 via a photolithography process. The first connection electrode CE1 may be connected to the second source electrode S2 of the second thin-film transistor ST2 through the source contact hole SCT. The second connection electrode CE2 may be connected to the second drain electrode D2 of the second thin-film transistor ST2 through the drain contact hole DCT and may be connected to the first sensing electrode PCE through the first sensing contact hole RCT1. The third connection electrode CE3 may be connected to the second sensing electrode PAE through the second sensing contact hole RCT2.

An inorganic material may be deposited on the first connection electrode CE1, the second connection electrode CE2 and the third connection electrode CE3 to form a third insulating layer INS3. The third insulating layer INS3 may be omitted.

An organic material is deposited on the third insulating layer INS3 to form a planarization layer PLA.

Secondly, the light-transmitting film LT is formed on the fingerprint sensing layer 410, and mask patterns MS are formed on the light-transmitting layer LT (step S120 of FIG. 15).

Figure 17:
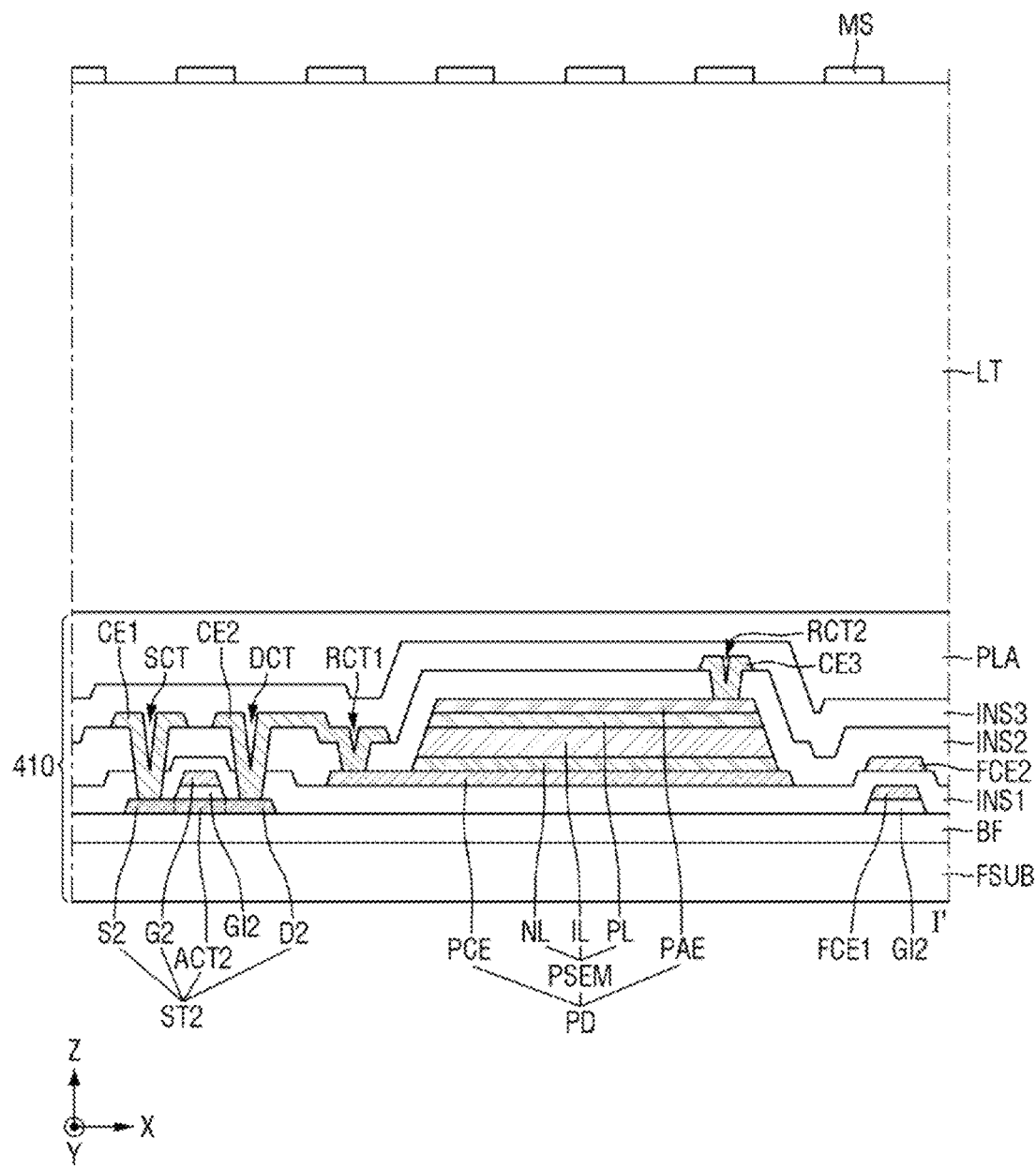

Referring to FIG. 17, an organic material is deposited on the fingerprint sensing layer 410 to form a light-transmitting layer LT. The length of the light-transmitting layer LT in the third direction (z-axis direction) may be several μm (e.g. 2 μm to 15 μm) or more. For example, the length of the light-transmitting layer LT in the third direction (z-axis direction) may be 5 μm or more. The light-transmitting layer LT may be an organic layer such as an acryl resin, an epoxy resin, a phenolic resin, a polyamide resin and a polyimide resin.

The mask patterns MS are formed by depositing an organic material or an inorganic material on the light-transmitting layer LT. The mask patterns MS may be disposed spaced apart from one another. The mask patterns MS may be arranged in the first direction (x-axis direction) with a first spacing and may be arranged in the second direction (y-axis direction) with a second spacing. The first spacing may be equal to the second spacing.

Each of the mask patterns MS may be an organic film such as photoresist. Alternatively, the mask patterns MS may be inorganic films, e.g., a transparent conductive oxide such as indium tin oxide (ITO) and indium zinc oxide (IZO), or aluminum (Al).

Thirdly, the first light-transmitting films LT1 are formed by etching the light-transmitting layer LT (step S130 in FIG. 15).

Figure 18:
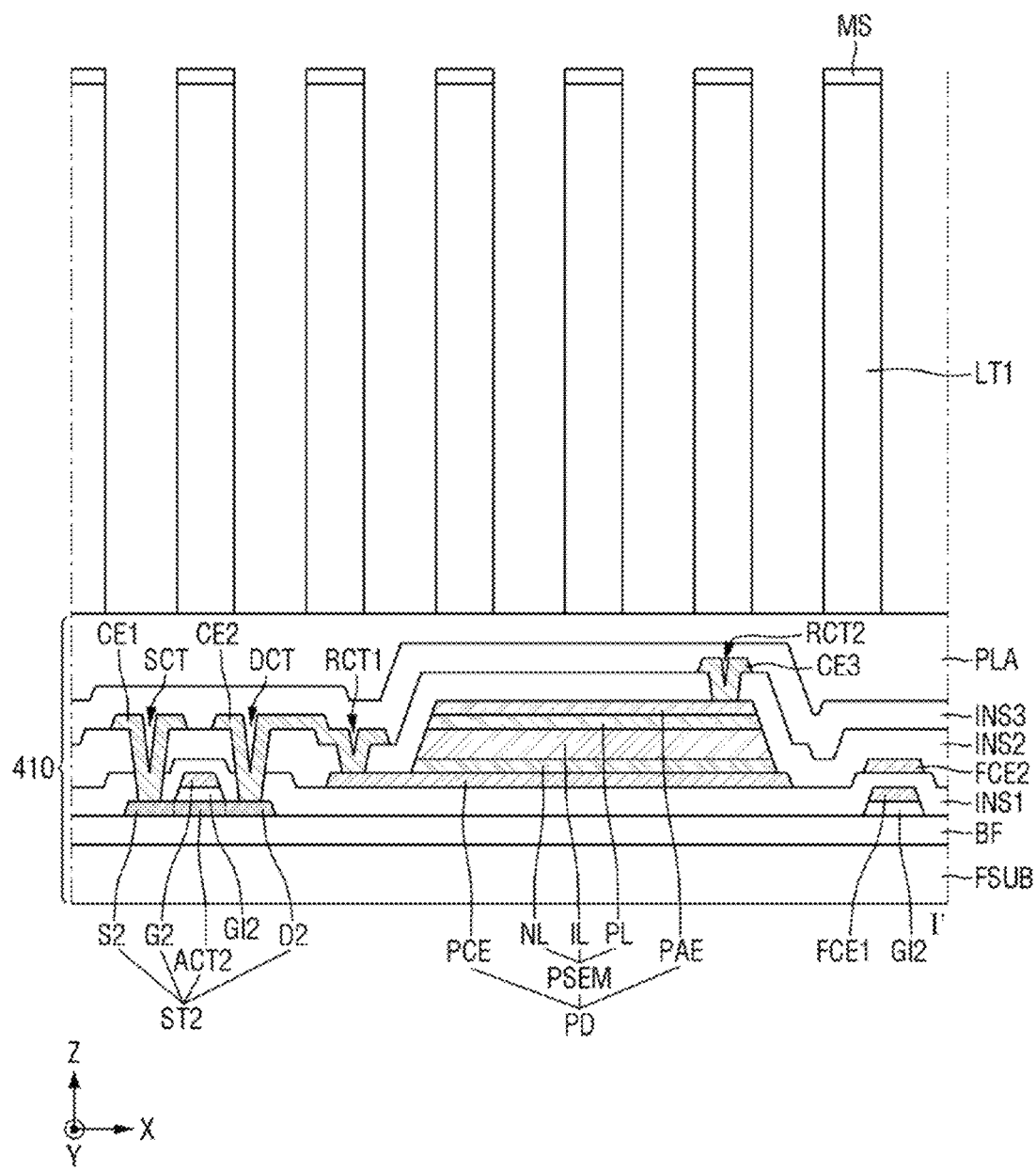

Referring to FIG. 18, the first light-transmitting films LT1 are formed by dry etching the light-transmitting layer LT not covered by the mask patterns MS. The first light-transmitting films LT1 may be spaced apart from one another. The first light-transmitting films LT1 may be arranged in the first direction (x-axis direction) with a first spacing and may be arranged in the second direction (y-axis direction) with a second spacing. The first spacing may be equal to the second spacing.

Figure 19:
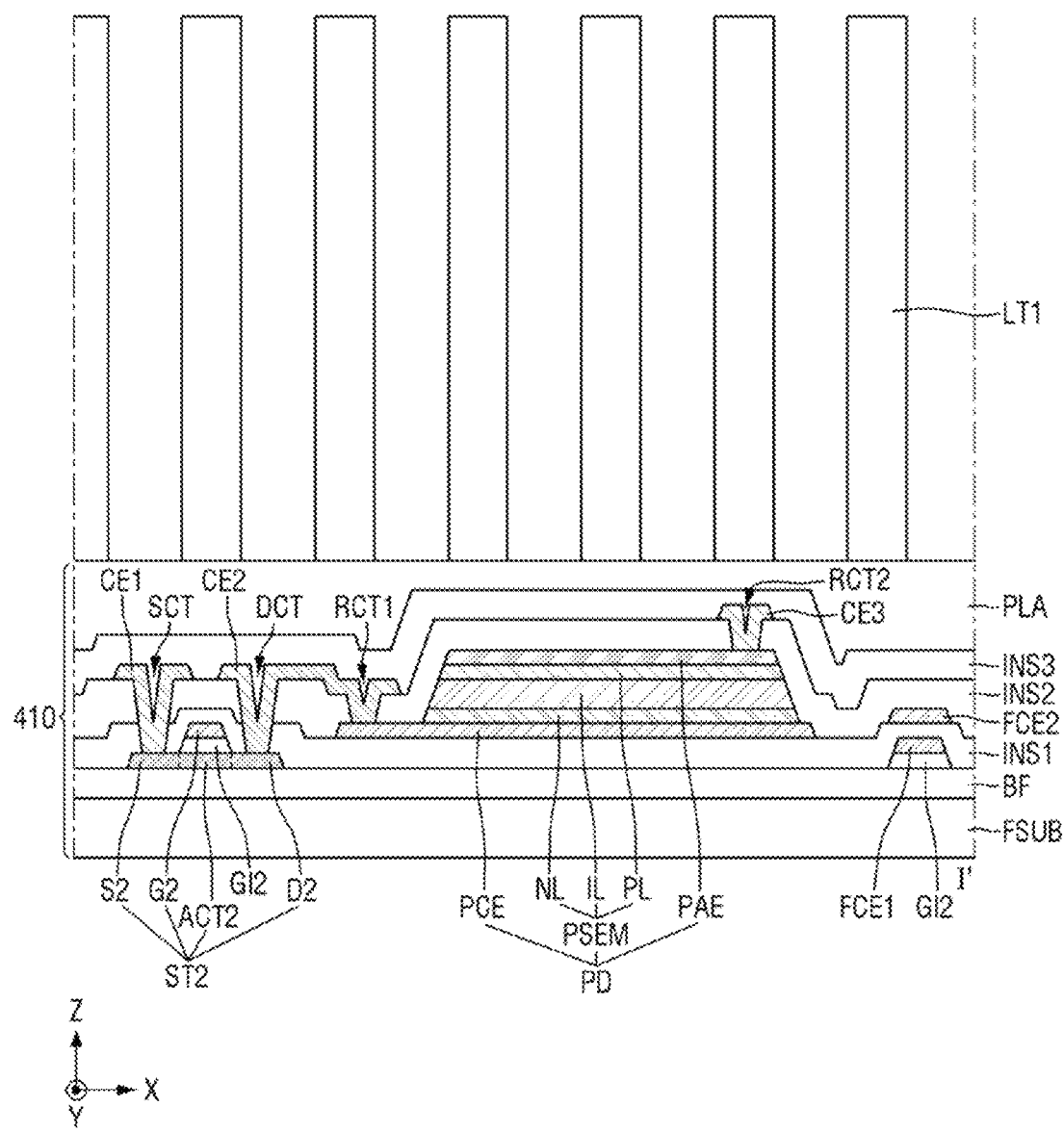

Fourthly, as shown in FIG. 19, the mask patterns MS are removed by a strip process or an etch process (step S140 in FIG. 15).

Fifthly, a second light-transmitting layer LT2 is formed on the first light-transmitting films LT1 (step S150 in FIG. 15).

Figure 20:
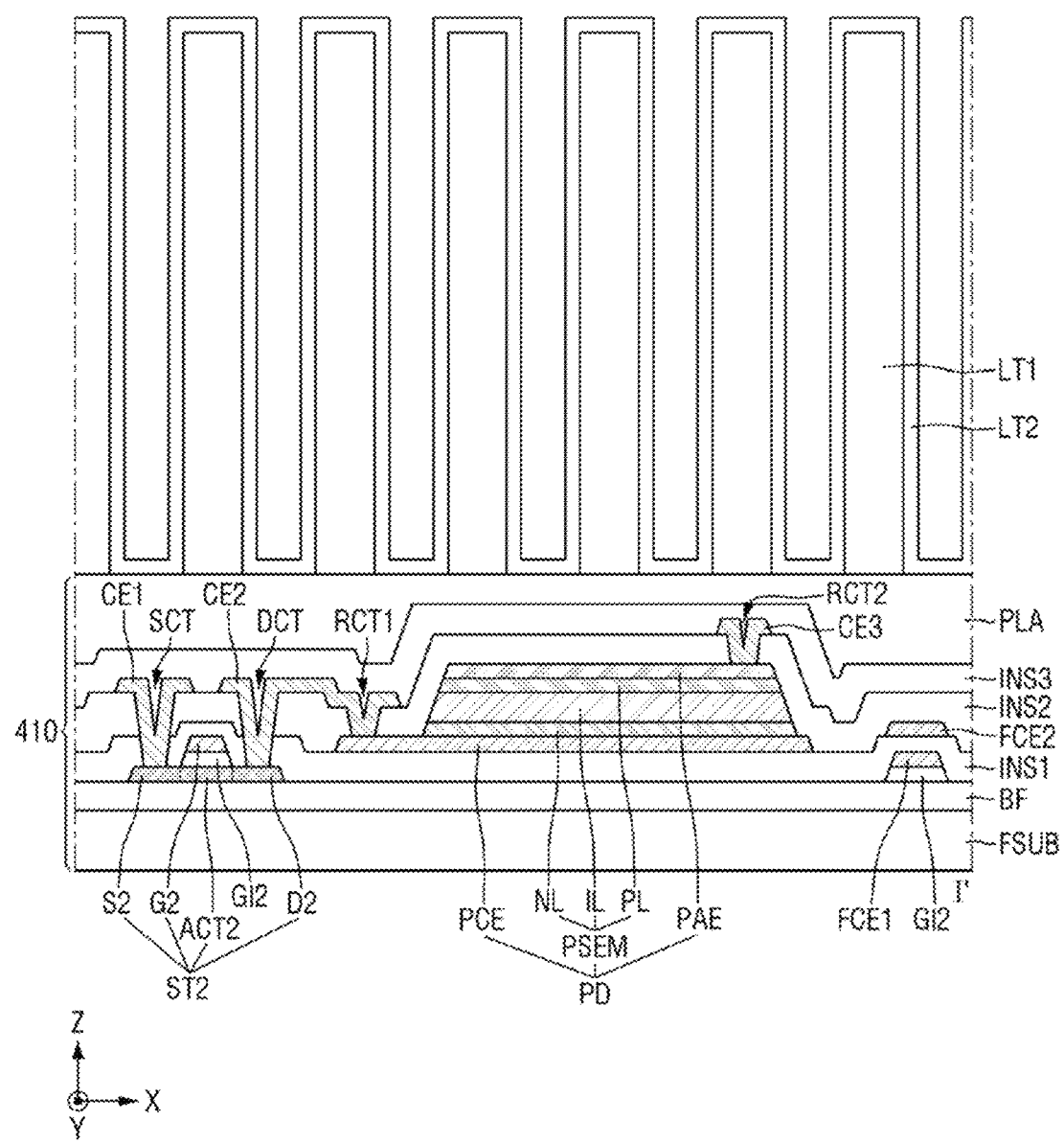

Referring to FIG. 20, an inorganic material is deposited on the first light-transmitting films LT1 to form a second light-transmitting layer LT2. The second light-transmitting layer LT2 may be formed on the upper surface and side surfaces of each of the first light-transmitting films LT1. In addition, the second light-transmitting layer LT2 may be formed on the planarization layer PLA of the fingerprint sensing layer 410 between the first light-transmitting films LT1. Since the second light-transmitting layer LT2 has good step coverage, it can be continuously extended without becoming disconnected.

On the other hand, since the first light-transmitting layer LT1 is longer in the third direction (z-axis direction), the width of the first light-transmitting layer LT1 may be smaller than the width of the mask pattern MS if it is over-etched. As the first light-transmitting layer LT1 becomes narrower, the light-blocking film LS becomes larger, and accordingly the light transmittance of the opening OA may be lowered. Therefore, the reduced width of the first light-transmitting film may be compensated for, and accordingly the second light-transmitting layer LT2 is formed.

Sixthly, a light-blocking film LS is formed between the first light-transmitting films LT1 (step S160 in FIG. 15).

Figure 21:
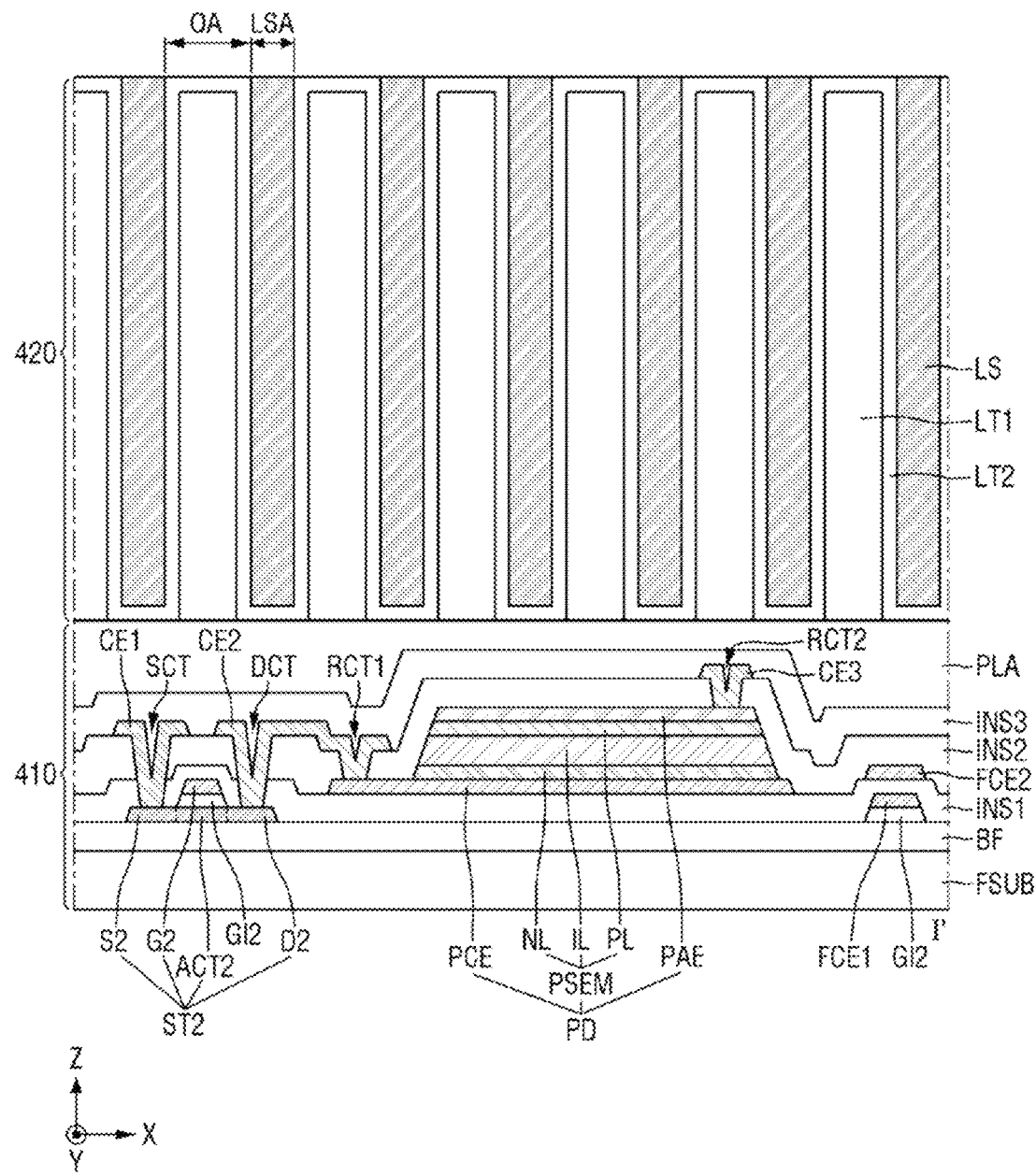

Referring to FIG. 21, an organic material is deposited on the second light-transmitting layer LT2 to form a light-blocking film, and then the light-blocking film is etched to form the light-blocking film LS. The side surfaces of the light-blocking film LS may be at least partially surrounded by the second light-transmitting layer LT2. In addition, a second light-transmitting layer LT2 may be disposed on the lower surface of the light-blocking film LS. The upper surface of the second light-transmitting layer LT2 and the upper surface of the light-blocking film LS may be flat.

As shown in FIGS. 15 to 21, a second light-transmitting layer LT2 is formed on the first light-transmitting films LT1. By doing so, it is possible to compensate for the reduced width of each of the first light-transmitting films LT1 due to the width of the second light-transmitting layer LT2 even if the width of each of the first light-transmitting films LT1 is reduced as the first light-transmitting films LT1 are over-etched during the etching process. As a result, it is possible to prevent the light transmittance of the opening OA from being lowered.

Figure 22:
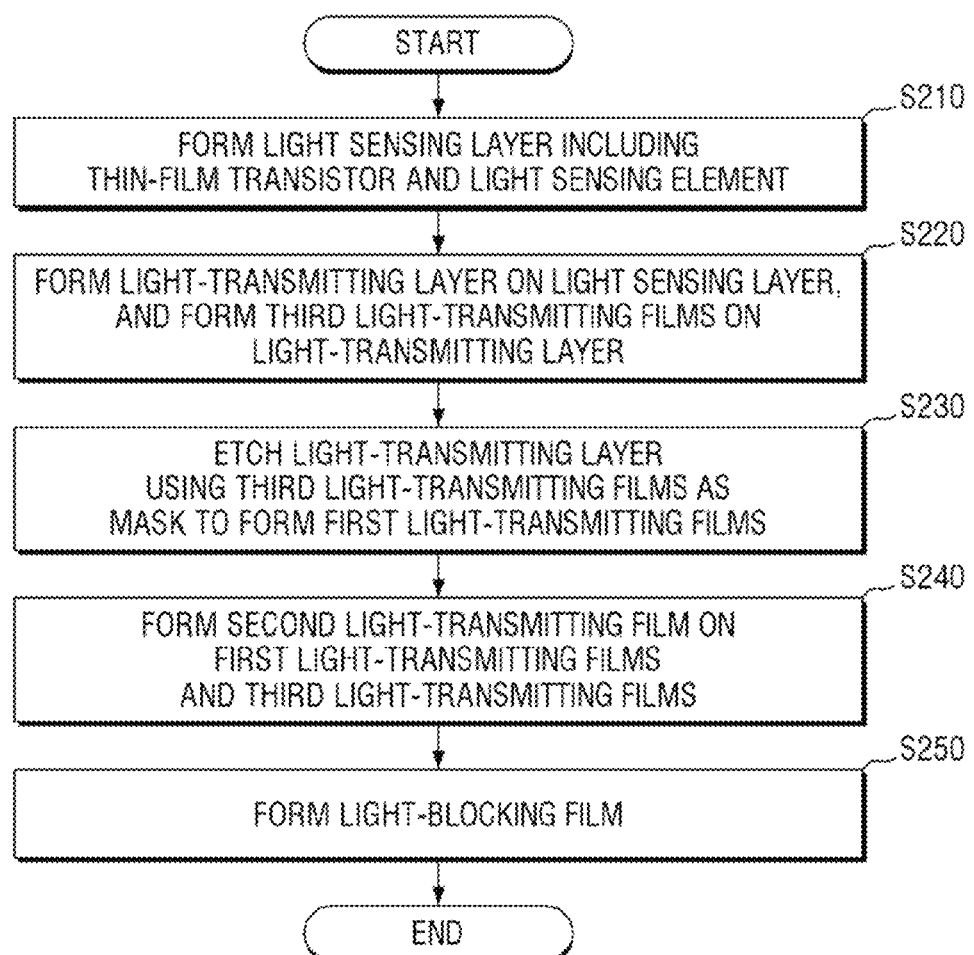
FIG. 22 is a flowchart illustrating a method of fabricating a fingerprint sensor according to an exemplary embodiment of the present disclosure.
Figure 23:
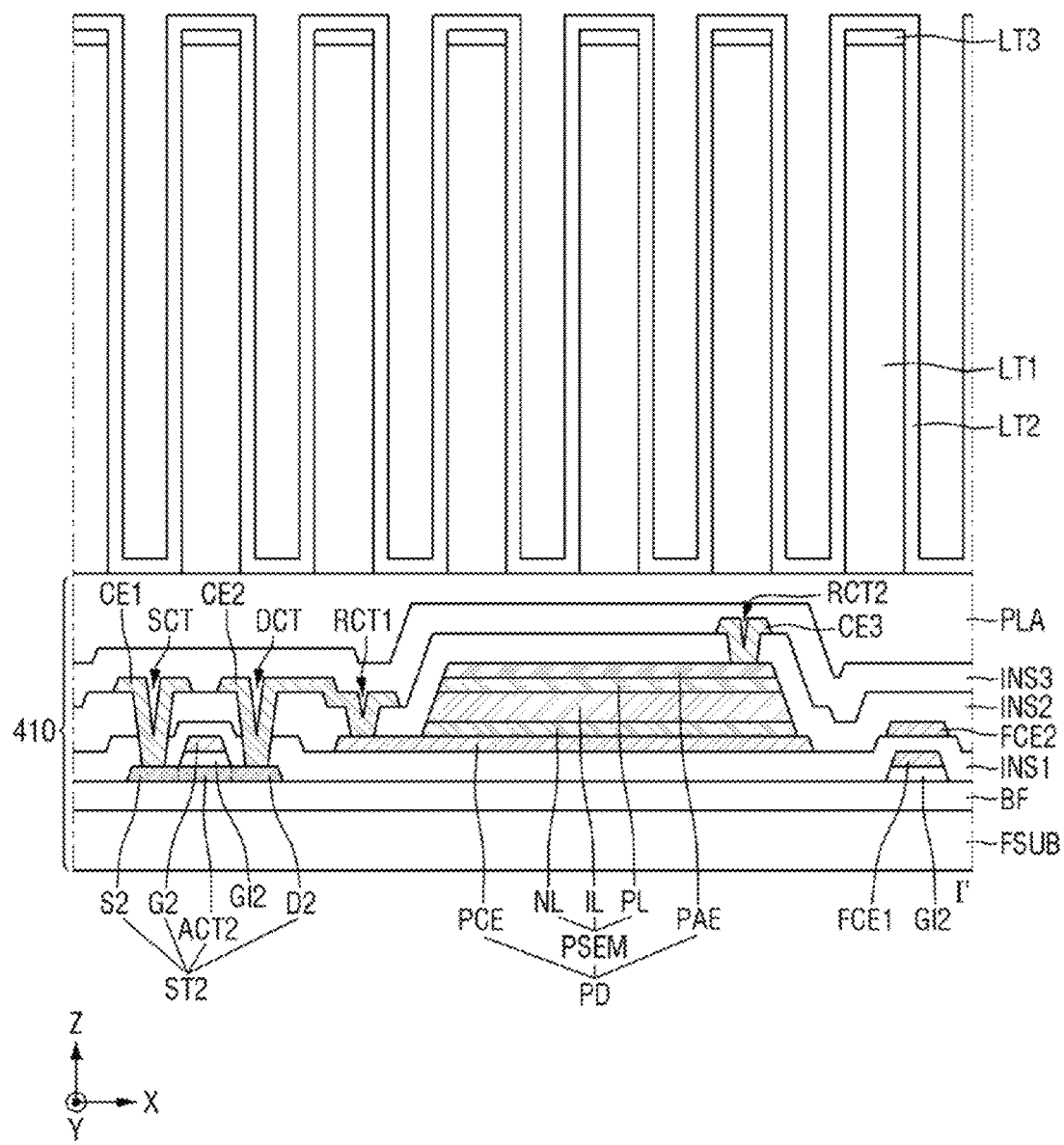
FIGS. 23 to 24 are cross-sectional views illustrating a method of fabricating the fingerprint sensor of FIG. 22.
Figure 24:
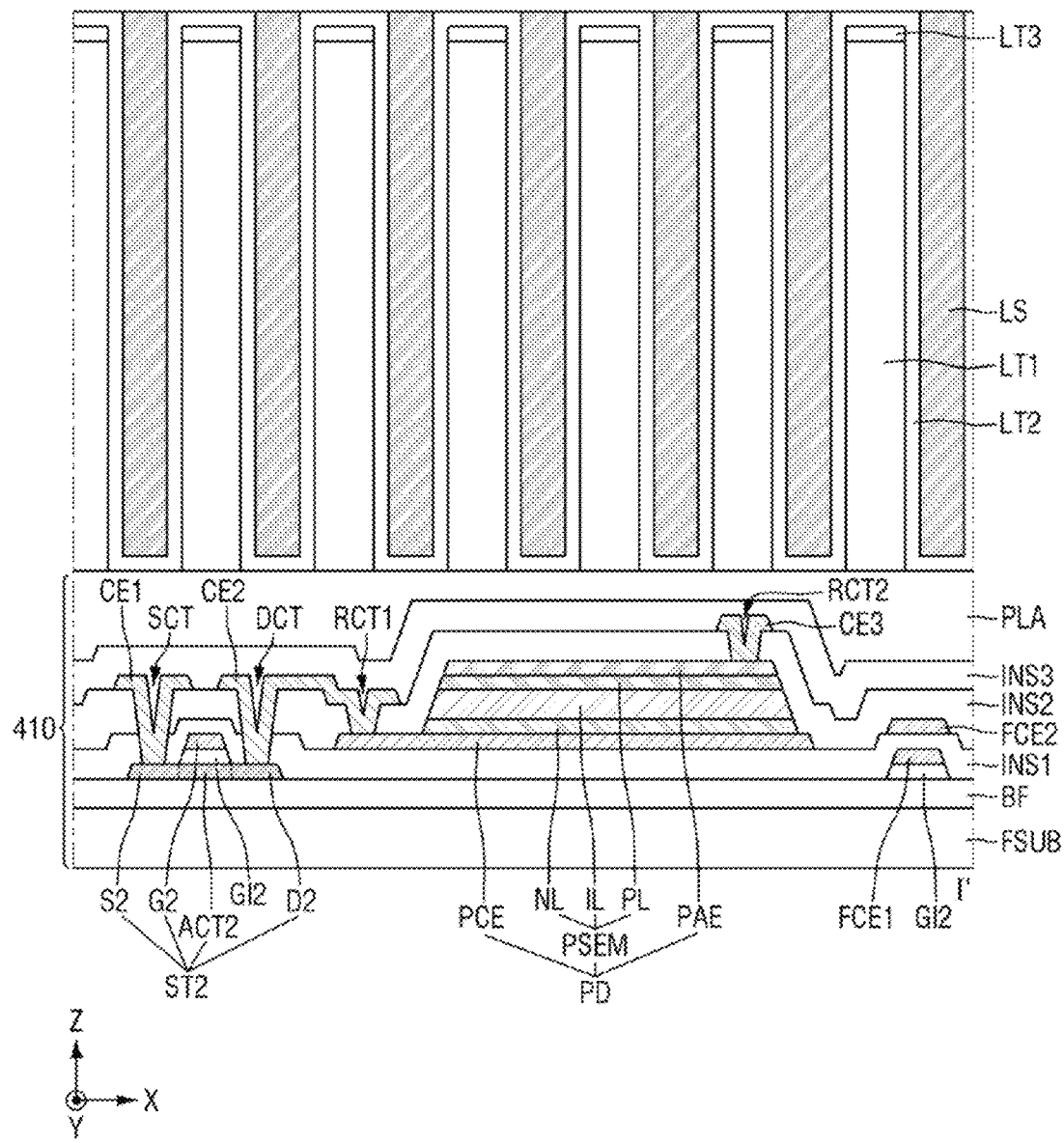

FIG. 22 is a flowchart illustrating a method of fabricating a fingerprint sensor according to an exemplary embodiment of the present disclosure. FIGS. 23 to 24 are cross-sectional views illustrating a method of fabricating the fingerprint sensor of FIG. 22.

Hereinafter, a method of fabricating a fingerprint sensor 400 according to an exemplary embodiment will be described in detail with reference to FIGS. 22 to 24.

The steps S210 to S230 of FIG. 22 are substantially identical to the steps S110 to S130 of FIG. 15 except that third light-transmitting films LT3 are formed instead of mask patterns MS.

Since the third light-transmitting films LT3 are used as a mask, they are substantially identical to the mask patterns MS. It is to be noted that the third light-transmitting films LT3 may include a material that can transmit light. For example, each of the third light-transmitting films LT3 may include an organic film such as a photoresist. Alternatively, each of the third light-transmitting films LT3 may include an inorganic film, e.g., a transparent conductive oxide such as indium tin oxide (ITO) and indium zinc oxide (IZO).

Referring to FIG. 22, a second light-transmitting layer LT2 is formed on the first light-transmitting films LT1 and the third light-transmitting films LT3 (step S240 in FIG. 22).

The second light-transmitting layer LT2 may be formed on the side surfaces of each of the first light-transmitting films LT1 and the upper surface and side surfaces of each of the third light-transmitting films LT3. In addition, the second light-transmitting layer LT2 may be formed on the planarization layer PLA of the fingerprint sensing layer 410 between the first light-transmitting films LT1. Since the second light-transmitting layer LT2 has good step coverage, it can be continuously extended without becoming disconnected.

Referring to FIG. 24, a light-blocking film LS is formed between the first light-transmitting films LT1 (step S250 in FIG. 22).

An organic material is deposited on the second light-transmitting layer LT2 to form a light-blocking film, and then the light-blocking film is etched to form the light-blocking film LS. The side surfaces of the light-blocking film LS may be at least partially surrounded by the second light-transmitting layer LT2. In addition, a second light-transmitting layer LT2 may be disposed on the lower surface of the light-blocking film LS. The upper surface of the second light-transmitting layer LT2 and the upper surface of the light-blocking film LS may be flat.

As shown in FIGS. 22 to 24, the second light-transmitting layer LT2 is formed on the third light-transmitting films LT3 without removing the third light-transmitting films LT3. Accordingly, the process of removing the third light-transmitting films LT3 can be omitted. Therefore, it is possible to increase the efficiency of the process of fabricating the fingerprint sensor 400.

In a fingerprint sensor, a method of fabricating the same, and a display device including the same according to an exemplary embodiment of the present inventive concept, a second light-transmitting film is disposed between each of the first light-transmitting films and the light-blocking film, and the refractive index of the first light-transmitting film is substantially equal to the refractive index of the second light-transmitting film. In this manner, it is possible to reduce light that can be sensed as noise among the light incident on the light sensing element, thereby increasing the accuracy of finger fingerprint recognition.

In a fingerprint sensor, a method of fabricating the same, and a display device including the same according to an exemplary embodiment of the present inventive concept, the refractive index of the first light-transmitting film is higher than that of the second light-transmitting film. Accordingly, it is possible to increase the amount of light incident on the light sensing element through the opening of the light guide layer.

In a fingerprint sensor, a method of fabricating the same, and a display device including the same according to an exemplary embodiment of the present inventive concept, it is possible to block infrared light that is noise light incident on the light sensing element by disposing a color filter such as a green color filter and a cyan color filter on the second light-transmitting film and the light-blocking film.

In a fingerprint sensor, a method of fabricating the same, and a display device including the same according to an exemplary embodiment of the present inventive concept, since the second light-transmitting film is formed on the first light-transmitting films, it is possible to compensate for a reduced width of each of the first light-transmitting films by the width of the second light-transmitting film even if the width of each of the first light-transmitting films is reduced as they are overetched during an etching process. Therefore, it is possible to prevent the light transmittance of the opening from being lowered.

While the present inventive concept has been particularly shown and described with reference to the exemplary embodiments thereof, it will be understood by those of ordinary skill in the art that various changes in form and detail may be made thereto without departing from the spirit and scope of the present inventive concept.

What is claimed is:
1. A fingerprint sensor, comprising:
   a light sensing layer comprising a light sensing element; and
   a light guide layer disposed on the light sensing layer, wherein the light guide layer comprises:
      a plurality of first light-transmitting films;
      a light-blocking film disposed between neighboring light-transmitting films of the plurality of first light-transmitting films; and
      a second light-transmitting film disposed between each of the plurality of first light-transmitting films and the light-blocking film,
   wherein the second light-transmitting film is a single, continuous film, wherein the second light-transmitting film is disposed on a top surface of each of the plurality of first light-transmitting films and a lower surface of the light-blocking film, wherein the second light-transmitting film is disposed between a side surface of each of the plurality of first light-transmitting films and a side surface of the light-blocking film, and wherein the second light-transmitting film is not disposed on a lower surface of each of the plurality of first light-transmitting films and a top surface of the light-blocking film.

2. The fingerprint sensor of claim 1, wherein a refractive index of each of the plurality of first light-transmitting films is equal to a refractive index of the second light-transmitting film.

3. The fingerprint sensor of claim 2, wherein each of the plurality of first light-transmitting films is an organic film, and the second light-transmitting film is an inorganic film.

4. The fingerprint sensor of claim 1, wherein a refractive index of each of the plurality of first light-transmitting films is larger than a refractive index of the second light-transmitting film.

5. The fingerprint sensor of claim 4, wherein each of the plurality of first light-transmitting films is an organic film, and the second light-transmitting film is an inorganic film.

6. The fingerprint sensor of claim 1, wherein a length of one of the plurality of first light-transmitting films in a particular direction is larger than a length of the light-blocking film in the particular direction that is disposed between adjacent ones of the plurality of first light-transmitting films in the particular direction.

7. The fingerprint sensor of claim 1, further comprising: a third light-transmitting film disposed on an upper surface of each of the plurality of first light-transmitting films and covered by the second light-transmitting film.

8. The fingerprint sensor of claim 7, wherein a refractive index of each of the plurality of first light-transmitting films is equal to a refractive index of the third light-transmitting film.

9. The fingerprint sensor of claim 7, wherein a refractive index of each of the plurality of first light-transmitting films is larger than a refractive index of the third light-transmitting film.

10. The fingerprint sensor of claim 7, wherein the third light-transmitting film is made of photoresist or transparent conductive oxide.

11. The fingerprint sensor of claim 1, wherein a height of the light-blocking film is smaller than a height of each of the plurality of first light-transmitting films.

12. The fingerprint sensor of claim 11, further comprising: a transparent adhesive member disposed on the light-blocking film and having a refractive index greater than that of each of the plurality of first light-transmitting films.

13. The fingerprint sensor of claim 1, further comprising: a color filter disposed on the second light-transmitting film and the light-blocking film.

14. The fingerprint sensor of claim 13, wherein the color filter transmits light in a wavelength hand corresponding to green light or light in the wavelength band corresponding to green light as well as light in a wavelength band corresponding to blue light.

15. The display device of claim 1, wherein a highest level of the second light-transmitting film is planar with a highest level of the light-blocking film and a lowest level of the second light-transmitting film is planar with a lowest level of the first light-transmitting films.

16. A display device, comprising:
a display panel including a display area and a non-display area at least partially surrounding the display area, the display area including a plurality of pixels configured to display are image; and
a fingerprint sensor disposed within the display area of the display panel,
wherein the fingerprint sensor comprises a light sensing element and a light guide layer disposed on the light sensing element,
wherein the light guide layer comprises:
a plurality of first light-transmitting films;
a light-blocking film disposed between neighboring light-transmitting films of the plurality of first light-transmitting films; and
a second light-transmitting film disposed between each of the plurality of first light-transmitting films and the light-blocking film,
wherein the second light-transmitting film is a single, continuous film,
wherein the second light-transmitting film is disposed on a top surface of each of the plurality of first light-transmitting films and a lower surface of the light-blocking film,
wherein the second light-transmitting film is disposed between a side surface of each of the plurality of first light-transmitting films and a side surface of the light-blocking film, and
wherein the second light-transmitting film is not disposed on a lower surface of each of the plurality of first light-transmitting films and a top surface of the light-blocking film.

17. The display device of claim 16, wherein a refractive index of each of the plurality of first light-transmitting films is equal to a refractive index of the second light-transmitting film.

18. The display device of claim 16, wherein a refractive index of each of the plurality of first light-transmitting films is larger than a refractive index of the second light-transmitting film.

19. The display device of claim 16, wherein each of the plurality of first light-transmitting films is an organic film, and the second light-transmitting film is an inorganic film.

20. The display device of claim 16, wherein second light-transmitting file is disposed on an upper surface and side surfaces of each of the plurality of first light-transmitting films, and
wherein the second light-transmitting film is not disposed on a bottom surface of each of the plurality of first light-transmitting films.

21. The display device of claim 16, wherein the second light-transmitting film is disposed on a lower surface of the light-blocking film, and
wherein the second light-transmitting film is not disposed on an upper surface of the light-blocking film.

22. The display device of claim 16, wherein a length of one of the plurality of first light-transmitting films in a particular direction is larger than a length of the light-blocking film in the particular direction that is disposed between adjacent ones of the plurality of first light-transmitting films in the particular direction.

23. The display device of claim 16, wherein a height of the light-blocking film is smaller than a height of each of the plurality of first light-transmitting films.

24. The display device of claim 16, further comprising: a color filter disposed on the second light-transmitting film and the light-blocking film.

25. The display device of claim 16, wherein a length of the second light-transmitting film in a thickness direction of the display panel is larger than a length of the first light-transmitting film in the thickness direction and a length of the light-blocking film in the thickness direction.

26. The display device of claim 16, wherein the second light-transmitting film has a square wave shape.

* * * * *